US011899300B2

(12) United States Patent
Okuyama

(10) Patent No.: US 11,899,300 B2
(45) Date of Patent: Feb. 13, 2024

(54) DISPLAY DEVICE

(71) Applicant: Japan Display Inc., Tokyo (JP)

(72) Inventor: Kentaro Okuyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/210,982

(22) Filed: Jun. 16, 2023

(65) Prior Publication Data

US 2023/0418097 A1    Dec. 28, 2023

(30) Foreign Application Priority Data

Jun. 23, 2022  (JP) ................................ 2022-101431

(51) Int. Cl.
*G02F 1/1333* (2006.01)
*G02F 1/1362* (2006.01)
*G02F 1/1334* (2006.01)
*H01L 27/12* (2006.01)
*G02F 1/1343* (2006.01)

(52) U.S. Cl.
CPC ...... *G02F 1/133345* (2013.01); *G02F 1/1334* (2013.01); *G02F 1/134309* (2013.01); *G02F 1/136286* (2013.01); *H01L 27/124* (2013.01); *G02F 2201/50* (2013.01)

(58) Field of Classification Search
CPC .......... G02F 2201/50; G02F 1/136286; G02F 1/134309; G02F 1/1334; G02F 1/133345; H01L 27/124
See application file for complete search history.

(56) References Cited

U.S. PATENT DOCUMENTS

| | | | |
|---|---|---|---|
| 6,781,651 B2* | 8/2004 | Song ................. | G02F 1/136209 349/110 |
| 2005/0099573 A1* | 5/2005 | Kubo ................ | G02F 1/134309 349/146 |
| 2005/0179849 A1* | 8/2005 | Nomura ................ | G02F 1/1345 349/149 |
| 2018/0031758 A1 | 2/2018 | Mizuno et al. | |
| 2020/0150490 A1 | 5/2020 | Mizuno et al. | |
| 2021/0116759 A1 | 4/2021 | Mizuno et al. | |
| 2022/0113593 A1 | 4/2022 | Mizuno et al. | |
| 2022/0187652 A1 | 6/2022 | Sugiyama et al. | |

FOREIGN PATENT DOCUMENTS

JP    2018-021974 A    2/2018

* cited by examiner

*Primary Examiner* — Mariam Qureshi
(74) *Attorney, Agent, or Firm* — K&L Gates LLP

(57) ABSTRACT

A display device includes an array substrate, a counter substrate, and a liquid crystal layer between the array substrate and the counter substrate. The array substrate includes signal lines, scan lines, a grid-shaped organic insulating layer covering over the scan lines and the signal lines, pixel electrodes, and a first orientation film covering the pixel electrodes. A portion of each pixel electrode is provided above a slant surface of the organic insulating layer and overlaps the slant surface. The counter substrate includes a common electrode overlapping the pixel electrodes, an insulating protective film covering the common electrode, and a second orientation film covering the protective film and the common electrode. A region overlapping an opening surrounded by the scan lines and the signal lines has a non-overlapping region of the protective film where the common electrode and the second orientation film are directly stacked without interposing the protective film therebetween.

8 Claims, 21 Drawing Sheets

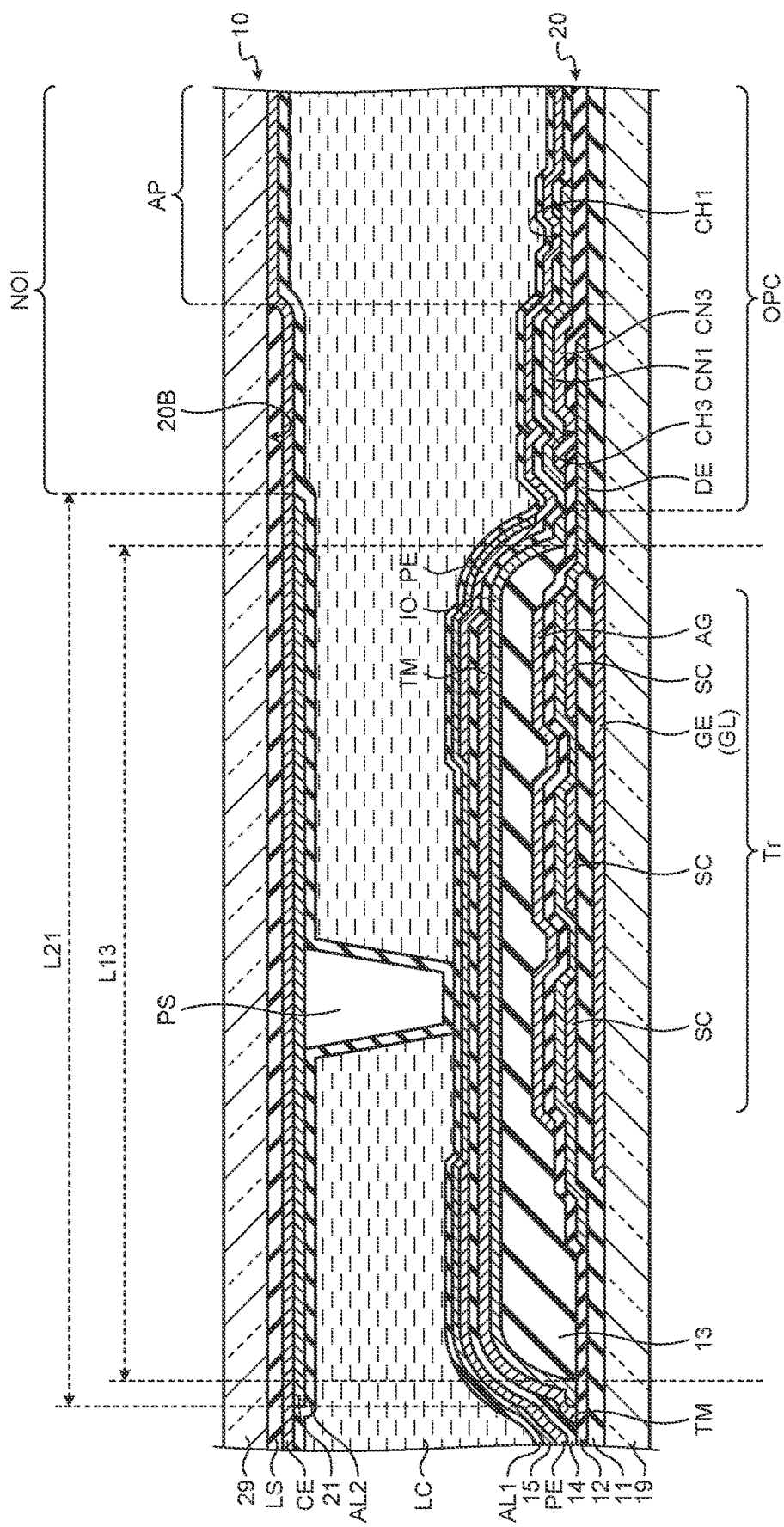

DISPLAY DEVICE

CROSS-REFERENCE TO RELATED APPLICATION

This application claims the benefit of priority from Japanese Patent Application No. 2022-101431 filed on Jun. 23, 2022, the entire contents of which are incorporated herein by reference.

BACKGROUND

1. Technical Field

What is disclosed herein relates to a display device.

2. Description of the Related Art

Japanese Patent Application Laid-open Publication No. 2018-021974 (JP-A-2018-021974) and United States Patent Application Publication No. 2022/0187652 each describe a display device that includes a first light-transmitting substrate, a second light-transmitting substrate disposed so as to face the first light-transmitting substrate, a liquid crystal layer including polymer-dispersed liquid crystals filled between the first and the second light-transmitting substrates, and at least one light emitter disposed so as to face at least one of side surfaces of the first and the second light-transmitting substrates.

In the display device described in JP-A-2018-021974, a viewer on one surface side of a display panel can view a background on the other surface side opposite to the one surface side. The transmittance of light from the one surface side of the display panel to the other surface side opposite thereto is requested to be improved.

For the foregoing reasons, there is a need for a display device that reduces occurrence of short circuit between a pixel electrode and a common electrode while improving the transmittance of the light from the one surface side of the display panel to the other surface side opposite thereto.

SUMMARY

According to an aspect, a display device includes: an array substrate; a counter substrate; and a liquid crystal layer between the array substrate and the counter substrate. The array substrate includes, in a display region: a plurality of signal lines arranged at intervals in a first direction; a plurality of scan lines arranged at intervals in a second direction; a grid-shaped organic insulating layer that is provided along the scan lines and the signal lines in the array substrate and covers over the scan lines and the signal lines; a plurality of pixel electrodes each provided in a region surrounded by the scan lines and the signal lines; and a first orientation film that covers the pixel electrodes. A portion of each of the pixel electrodes is provided above a slant surface of the organic insulating layer and overlaps the slant surface. The counter substrate includes: a common electrode located at a location that overlaps at least the pixel electrodes; an insulating protective film that covers the array substrate side of the common electrode that overlaps at least a portion of the organic insulating layer; and a second orientation film that covers the protective film and the common electrode. A region overlapping an opening surrounded by the scan lines and the signal lines has a non-overlapping region of the protective film where the common electrode and the second orientation film are directly stacked without interposing the protective film between the common electrode and the second orientation film.

BRIEF DESCRIPTION OF THE DRAWINGS

FIG. 22 is a sectional view illustrating an example of a section of the display device according to a third embodiment of the present disclosure.

DETAILED DESCRIPTION

Figure 1:
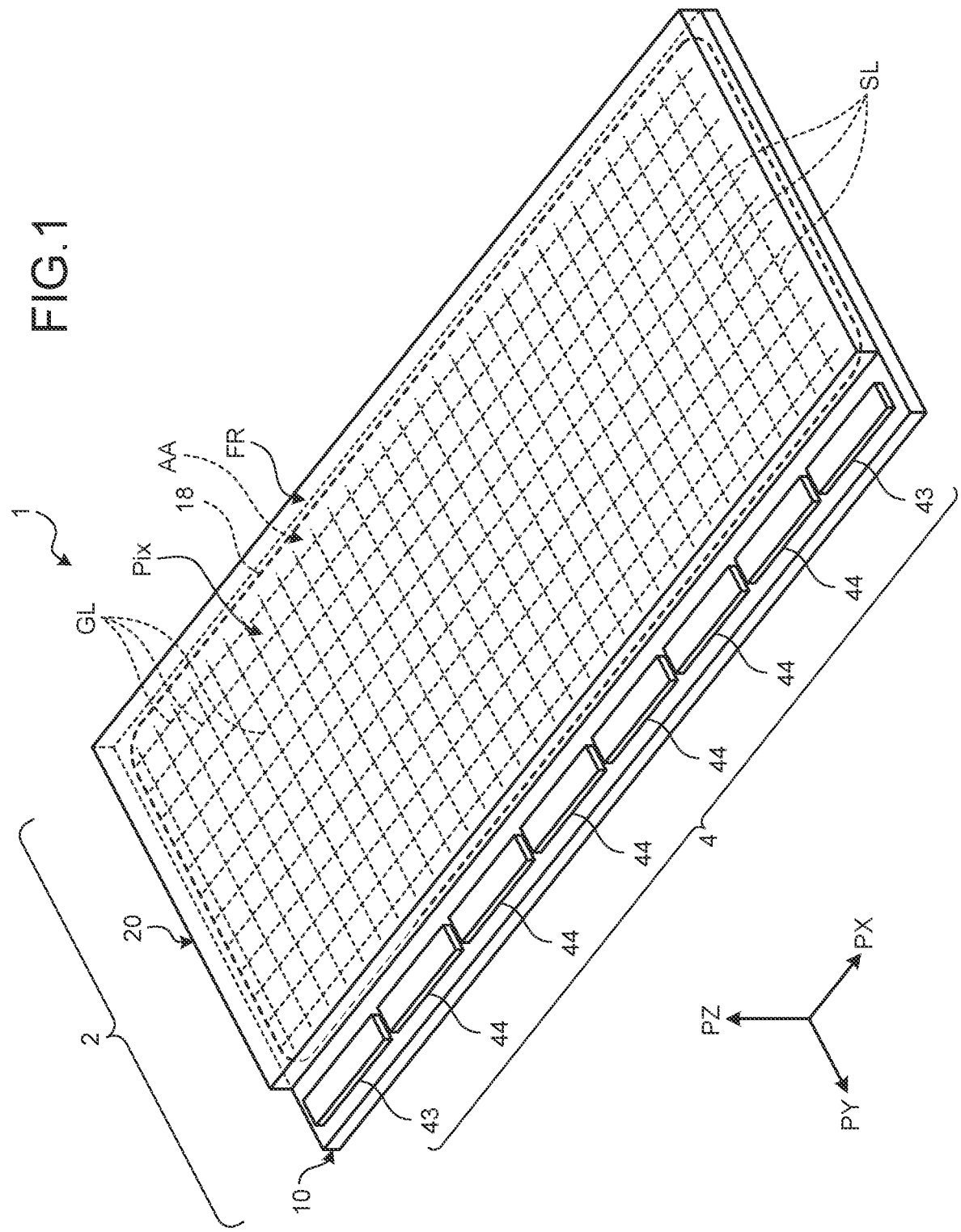
FIG. 1 is a perspective view illustrating an example of a display panel according to an embodiment of the present disclosure.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

First Embodiment

Figure 2:
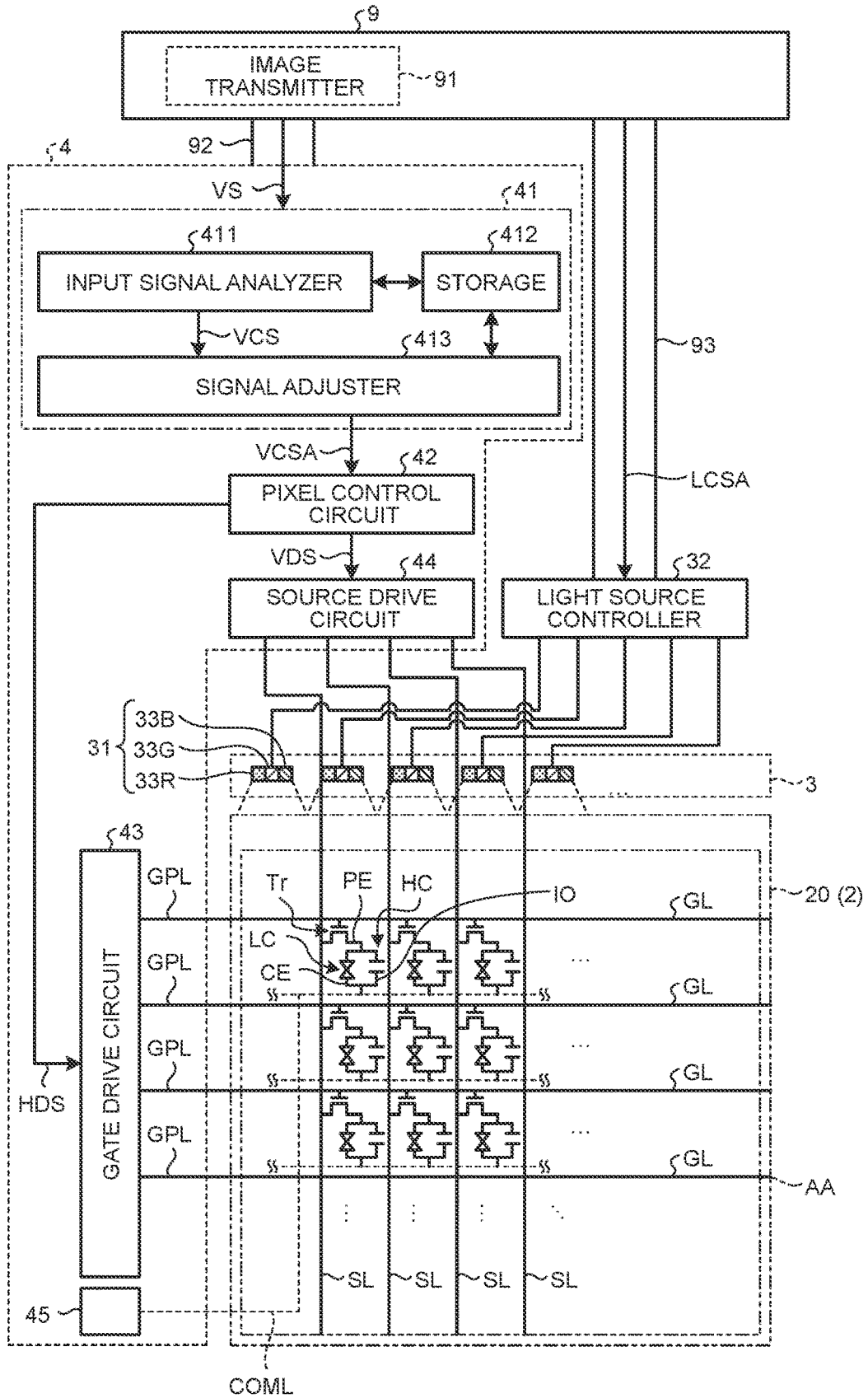
FIG. 2 is a block diagram illustrating a display device according to a first embodiment of the present disclosure.
Figure 3:
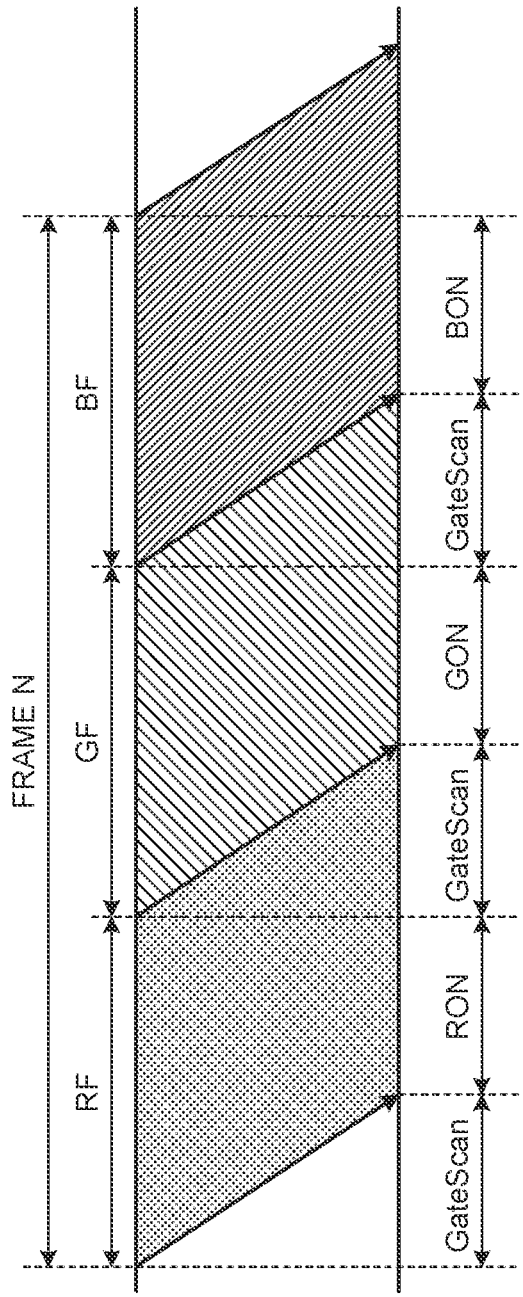
FIG. 3 is a timing diagram explaining timing of light emission by a light source in a field-sequential system of the first embodiment.

FIG. 1 is a perspective view illustrating an example of a display panel according to an embodiment of the present disclosure. FIG. 2 is a block diagram illustrating a display device according to a first embodiment of the present disclosure. FIG. 3 is a timing diagram explaining timing of light emission by a light source in a field-sequential system.

As illustrated in FIG. 1, a display device 1 includes a display panel 2 and a drive circuit 4. An array substrate 10 has an area in a PX-PY plane larger than that of a counter substrate 20, and the drive circuit 4 is provided on a protruding portion of the array substrate 10 exposed from the counter substrate 20. The drive circuit 4 includes at least a gate drive circuit 43 and a source drive circuit 44, which are described later. A direction PX denotes one direction in the plane of the display panel 2. A second direction PY denotes a direction orthogonal to the direction PX. A third direction PZ denotes a direction orthogonal to the PX-PY plane.

Figure 5:
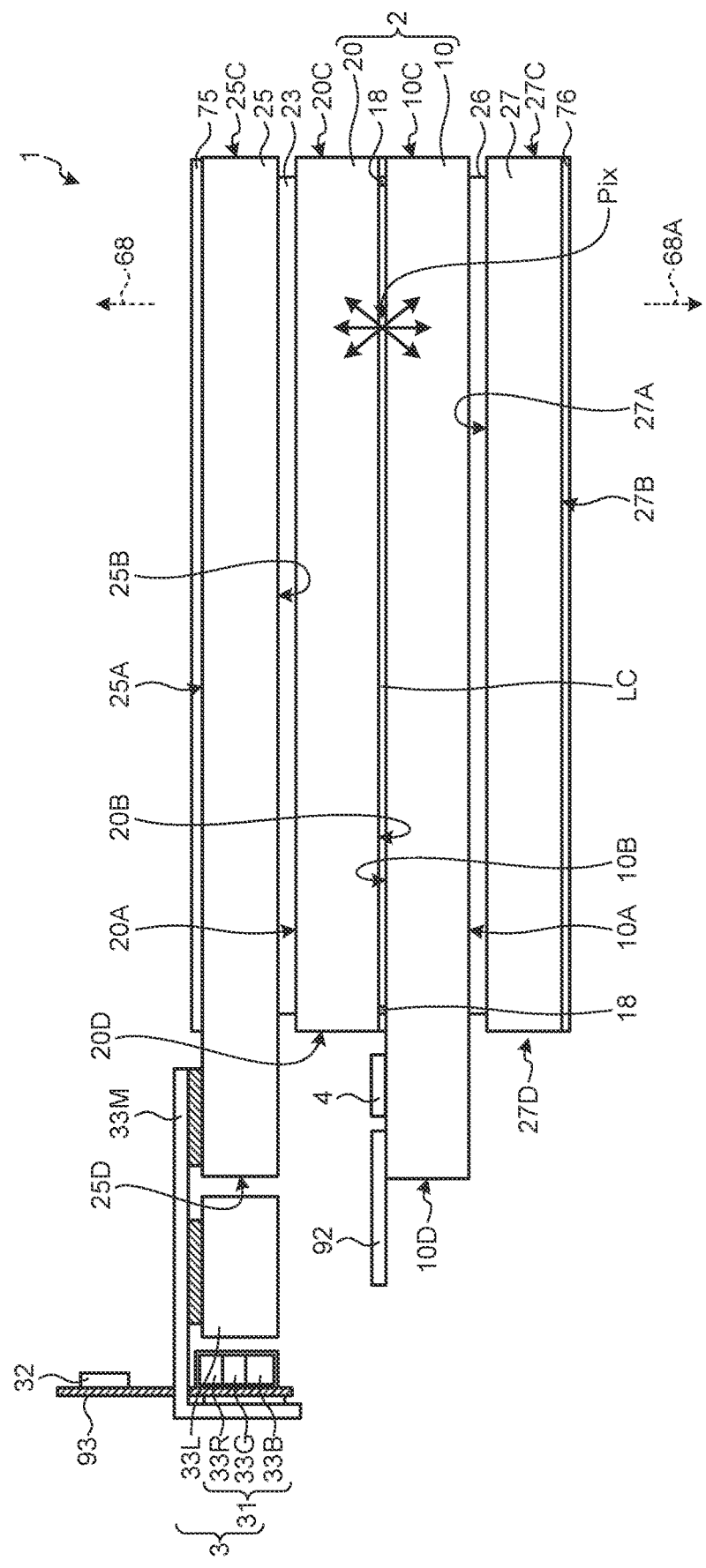
FIG. 5 is a sectional view illustrating an example of a section of the display device.

The display panel 2 includes the array substrate 10, the counter substrate 20, and a liquid crystal layer 50 (refer to FIG. 5). The array substrate 10 serves as a first light-transmitting substrate, and the counter substrate 20 serves as a second light-transmitting substrate. The counter substrate 20 faces a surface of the array substrate 10 in a direction orthogonal thereto (in the direction PZ illustrated in FIG. 1). In the liquid crystal layer 50 (refer to FIG. 5), polymer-dispersed liquid crystals LC (described later) are sealed by the array substrate 10, the counter substrate 20, and a sealing portion 18.

As illustrated in FIG. 1, the display panel 2 has an active region AA capable of displaying images and a peripheral region FR outside the active region AA. A plurality of pixels Pix are arranged in a matrix having a row-column configuration in the active region AA. In the present disclosure, a row refers to a pixel row including m pixels Pix arranged in one direction. In addition, a column refers to a pixel column including n pixels Pix arranged in a direction orthogonal to the direction in which the rows extend. The values of m and n are determined depending on a display resolution in the vertical direction and a display resolution in the horizontal direction. A plurality of scan lines GL are provided corresponding to the rows, and a plurality of signal lines SL are provided corresponding to the columns.

As illustrated in FIG. 2, a light source 3 includes a plurality of light emitters 31. A light source controller (light source control circuit) 32 is provided on a wiring substrate 93. The wiring substrate 93 is a flexible printed circuit board or a printed circuit board (PCB) substrate. A light source control signal LCSA is transmitted from an image transmitter 91 of an external higher-level controller 9 to the light source controller 32. The light source control signal LCSA is a signal including information on light quantities of the light emitters 31 set according to, for example, input gradation values given to the pixels Pix.

As illustrated in FIG. 1, the drive circuit 4 is fixed to the surface of the array substrate 10. As illustrated in FIG. 2, the drive circuit 4 includes a signal processing circuit 41, a pixel control circuit 42, the gate drive circuit 43, the source drive circuit 44, and a common potential drive circuit 45.

The signal processing circuit 41 receives a first input signal (such as a red-green-blue (RGB) signal) VS from the image transmitter 91 of the external higher-level controller 9 through a flexible printed circuit board 92.

The signal processing circuit 41 includes an input signal analyzer 411, a storage 412, and a signal adjuster 413. The input signal analyzer 411 generates a second input signal VCS based on the externally received first input signal VS.

The second input signal VCS is a signal for determining a gradation value to be given to each of the pixels Pix of the display panel 2 based on the first input signal VS. In other words, the second input signal VCS is a signal including gradation information on the gradation value of each of the pixels Pix.

The signal adjuster 413 generates a third input signal VCSA from the second input signal VCS. The signal adjuster 413 transmits the third input signal VCSA to the pixel control circuit 42.

The pixel control circuit 42 generates a horizontal drive signal HDS and a vertical drive signal VDS based on the third input signal VCSA. In the present embodiment, since the display device 1 is driven based on the field-sequential system, the horizontal drive signal HDS and the vertical drive signal VDS are generated for each color emittable by the light emitters 31.

The gate drive circuit 43 sequentially selects the scan lines GL of the display panel 2 based on the horizontal drive signal HDS within one vertical scan period. The scan lines GL can be selected in any order. The gate drive circuit 43 is electrically coupled to the scan lines GL through second wiring GPL arranged in the peripheral region FR outside the active region AA (refer to FIG. 1).

The source drive circuit 44 supplies gradation signals corresponding to output gradation values of the pixels Pix to the signal lines SL of the display panel 2 based on the vertical drive signal VDS within one horizontal scan period.

In the present embodiment, the display panel 2 is an active-matrix panel. Therefore, the display panel 2 includes the signal (source) lines SL extending in the second direction PY and the scan (gate) lines GL extending in the first direction PX in plan view, and includes switching elements Tr at intersecting portions between the signal lines SL and the scan lines GL.

A thin-film transistor is used as each of the switching elements Tr. A bottom-gate transistor or a top-gate transistor may be used as an example of the thin-film transistor. Although a single-gate thin film transistor is exemplified as the switching element Tr, the switching element Tr may be a double-gate transistor. One of the source electrode and the drain electrode of the switching element Tr is coupled to a corresponding one of the signal lines SL. The gate electrode of the switching element Tr is coupled to a corresponding one of the scan lines GL. The other of the source electrode and the drain electrode is coupled to one end of a capacitor of the polymer-dispersed liquid crystals LC described later. The capacitor of the polymer-dispersed liquid crystals LC is coupled at one end thereof to the switching element Tr through a pixel electrode PE, and coupled at the other end thereof to common potential wiring COML through a common electrode CE. Holding capacitance HC is generated between the pixel electrode PE and a holding capacitance electrode IO electrically coupled to the common potential wiring COML. The potential of the common potential wiring COML is supplied from the common potential drive circuit 45.

Each of the light emitters 31 includes a light emitter 33R of a first color (such as red), a light emitter 33G of a second color (such as green), and a light emitter 33B of a third color (such as blue). The light source controller 32 controls the light emitter 33R of the first color, the light emitter 33G of the second color, and the light emitter 33B of the third color so as to emit light in a time-division manner based on the light source control signal LCSA. In this manner, the light emitter 33R of the first color, the light emitter 33G of the second color, and the light emitter 33B of the third color are driven based on the field-sequential system.

As illustrated in FIG. 3, in a first sub-frame (first predetermined time) RF, the light emitter 33R of the first color emits light during a first color light emission period RON, and the pixels Pix selected during one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the first color is lit up during the first color light emission period RON.

Then, in a second sub-frame (second predetermined time) GF, the light emitter 33G of the second color emits light during a second color light emission period GON, and the pixels Pix selected during the one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the second color is lit up during the second color light emission period GON.

Further, in a third sub-frame (third predetermined time) BF, the light emitter 33B of the third color emits light during a third color light emission period BON, and the pixels Pix selected during the one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the third color is lit up during the third color light emission period BON.

Since a human eye has limited temporal resolving power and produces an afterimage, an image with a combination of three colors is recognized in a period of one frame (1F). The field-sequential system can eliminate the need for a color filter, and thus can reduce an absorption loss by the color filter. As a result, higher transmittance can be obtained. In the color filter system, one pixel is made up of sub-pixels obtained by dividing each of the pixels Pix into the sub-pixels of the first color, the second color, and the third color. In contrast, in the field-sequential system, the pixel may not be divided into the sub-pixels in such a manner. A fourth sub-frame may be further included to emit light in a fourth color different from any one of the first color, the second color, and the third color.

Figure 4:
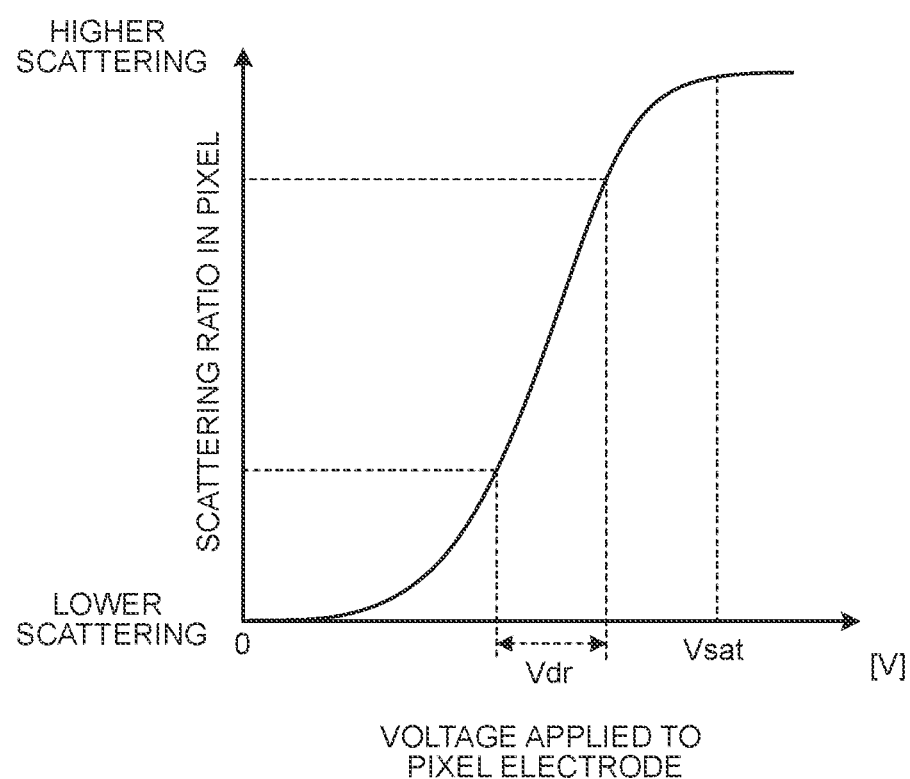
FIG. 4 is an explanatory diagram illustrating a relation between a voltage applied to a pixel electrode and a scattering state of a pixel.
Figure 6:
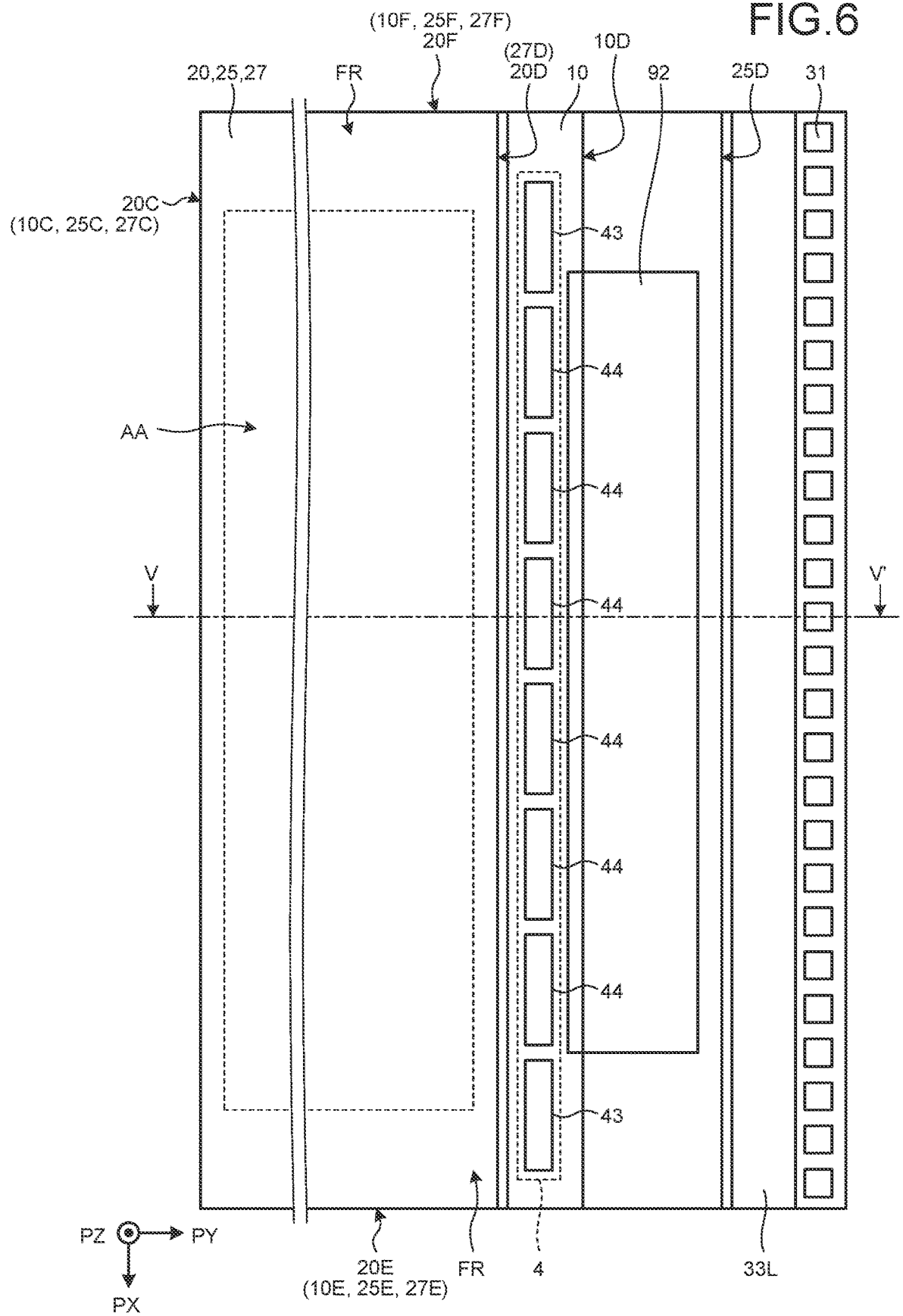
FIG. 6 is a plan view illustrating a planar surface of the display device of FIG. 1.
Figure 7:
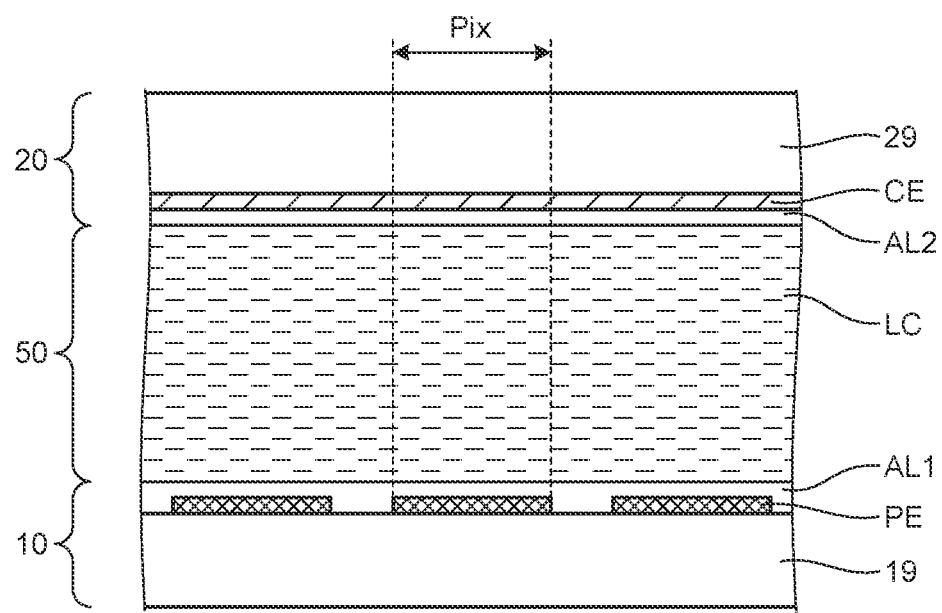
FIG. 7 is an enlarged sectional view obtained by enlarging a liquid crystal layer portion of FIG. 5.
Figure 8:
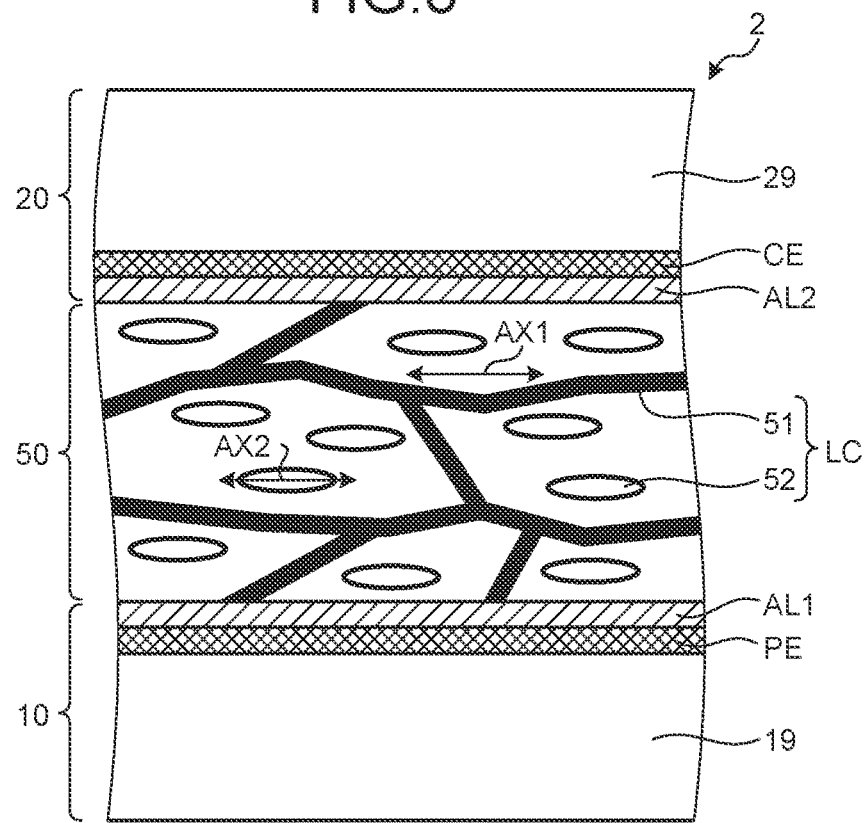
FIG. 8 is a sectional view for explaining a non-scattering state in the liquid crystal layer.
Figure 9:
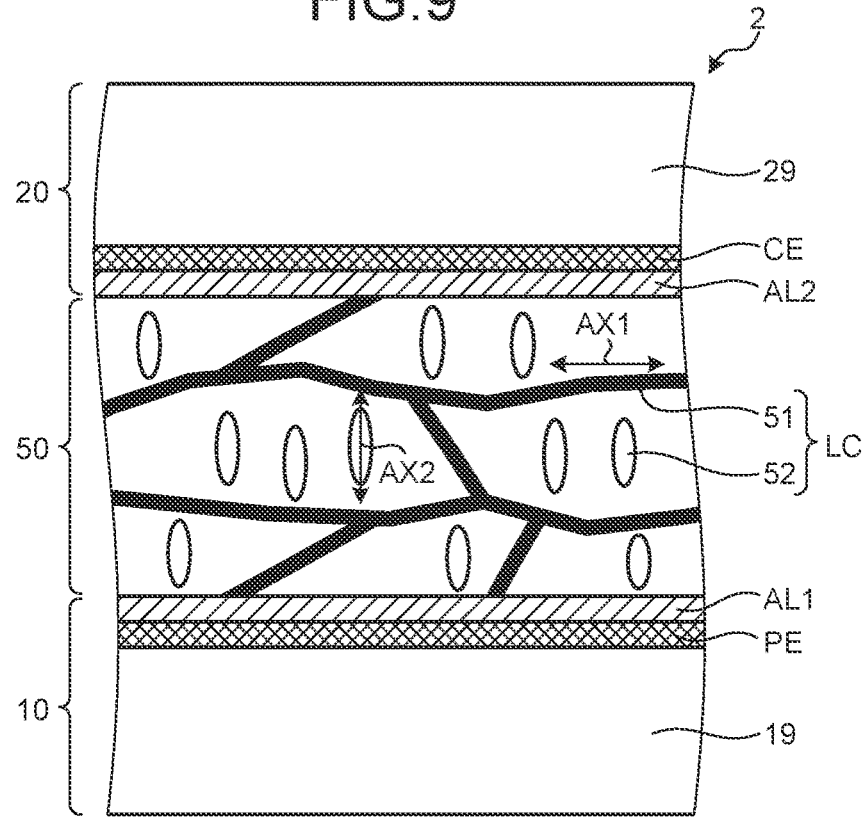
FIG. 9 is a sectional view for explaining the scattering state in the liquid crystal layer.

FIG. 4 is an explanatory diagram illustrating a relation between a voltage applied to the pixel electrode and a scattering state of the pixel. FIG. 5 is a sectional view illustrating an example of a section of the display device. FIG. 6 is a plan view illustrating a planar surface of the display device of FIG. 1. FIG. 7 is an enlarged sectional view obtained by enlarging the liquid crystal layer portion of FIG. 5. FIG. 8 is a sectional view for explaining a non-scattering state in the liquid crystal layer. FIG. 9 is a sectional view for explaining the scattering state in the liquid crystal layer.

If the gradation signal corresponding to the output gradation value of each of the pixels Pix is supplied to the above-described signal lines SL for the pixels Pix selected during the one vertical scan period GateScan, a voltage applied to the pixel electrode PE changes with the gradation signal. The change in the voltage applied to the pixel electrode PE changes the voltage between the pixel electrode PE and the common electrode CE. The scattering state of the liquid crystal layer 50 for each of the pixels Pix is controlled in accordance with the voltage applied to the pixel electrode PE, and the scattering ratio in the pixels Pix changes, as illustrated in FIG. 4.

As illustrated in FIG. 4, the change in the scattering rate in the pixel Pix is smaller when the voltage applied to the pixel electrode PE is equal to or higher than a saturation voltage Vsat. Therefore, the drive circuit 4 changes the voltage applied to the pixel electrode PE in accordance with the vertical drive signal VDS within a voltage range Vdr lower than the saturation voltage Vsat.

As illustrated in FIG. 5, the display device 1 includes a light-transmitting first base member 25, the display panel 2, and a light-transmitting second base member 27. A protective layer 75 is provided on one surface of the light-transmitting first base member 25. A protective layer 76 is provided on one surface of the light-transmitting second base member 27.

The display panel 2 includes the array substrate 10, the counter substrate 20, and the liquid crystal layer 50. The counter substrate 20 faces the surface of the array substrate 10 in the direction orthogonal thereto (in the direction PZ illustrated in FIG. 1). In the liquid crystal layer 50, the polymer-dispersed liquid crystals (described later) are sealed by the array substrate 10, the counter substrate 20, and the sealing portion 18.

As illustrated in FIGS. 5 and 6, the array substrate has a first principal surface 10A, a second principal surface 10B, a first side surface 10C, a second side surface 10D, a third side surface 10E, and a fourth side surface 10F. The first principal surface 10A and the second principal surface 10B are parallel flat surfaces. The first side surface 10C and the second side surface 10D are parallel flat surfaces. The third side surface 10E and the fourth side surface 10F are parallel flat surfaces.

As illustrated in FIGS. 5 and 6, the counter substrate has a first principal surface 20A, a second principal surface 20B, a first side surface 20C, a second side surface 20D, a third side surface 20E, and a fourth side surface 20F. The first principal surface 20A and the second principal surface 20B are parallel flat surfaces. The first side surface 20C and the second side surface 20D are parallel flat surfaces. The third side surface 20E and the fourth side surface 20F are parallel flat surfaces.

As illustrated in FIGS. 5 and 6, the first base member 25 has a first principal surface 25A, a second principal surface 25B, a first side surface 25C, a second side surface 25D, a third side surface 25E, and a fourth side surface 25F. The first principal surface 25A and the second principal surface 25B are parallel flat surfaces. The first side surface 25C and the second side surface 25D are parallel flat surfaces. The third side surface 25E and the fourth side surface 25F are parallel flat surfaces.

The first base member 25 is bonded to the first principal surface 20A of the counter substrate 20 with an optical resin 23 interposed therebetween. The first base member 25 is a protective substrate for the counter substrate 20 and is formed, for example, of glass or a light-transmitting resin. When the first base member 25 is formed of a glass base material, it is also called a cover glass. When the first base member 25 is formed of a light-transmitting resin, it may be flexible. The same base material as the first base member 25 may be bonded to the first principal surface 10A of the array substrate 10 with an optical resin interposed therebetween.

As illustrated in FIGS. 5 and 6, the second base member 27 has a first principal surface 27A, a second principal surface 27B, a first side surface 27C, a second side surface 27D, a third side surface 27E, and a fourth side surface 27F. The first principal surface 27A and the second principal surface 27B are parallel flat surfaces. The first side surface 27C and the second side surface 27D are parallel flat surfaces. The third side surface 27E and the fourth side surface 27F are parallel flat surfaces.

The second base member 27 is bonded to the first principal surface 10A of the array substrate 10 with an optical resin 26 interposed therebetween. The second base member 27 is a protective substrate for the array substrate and is formed, for example, of glass or a light-transmitting resin. When the second base member 27 is formed of a glass base material, it is also called a cover glass. When the second base member 27 is formed of a light-transmitting resin, it may be flexible.

As illustrated in FIGS. 5 and 6, the light source 3 faces the second side surface 25D of the first base member 25. The light source 3 may also be called a side light source. As illustrated in FIG. 5, the light source 3 emits light-source light to the second side surface 25D of the first base member 25. The second side surface 25D of the first base member 25 facing the light source 3 serves as a plane of light incidence. The plane of light incidence facing the light source 3 may be the second side surface 20D of the counter substrate 20 or the second side surface 27D of the second base member 27.

The light source 3 includes the light emitters 31 and a light guide 33L. The light emitters 31 include the light emitter 33R of the first color (such as red), the light emitter 33G of the second color (such as green), and the light emitter 33B of the third color (such as blue). The light guide 33L guides the light emitted by the light emitter 33R of the first color, the light emitter 33G of the second color, and the light emitter 33B of the third color to the second side surface 25D of the first base member 25. The light guide 33L receives the light simultaneously from the light emitters 31, internally diffuses the received light, and emits the diffused light to the display panel 2. As a result, the distribution of light per unit area irradiating the second side surface 25D of the first base member 25 is made uniform.

The light guide 33L is a single light guide 33L formed integrally from the third side surface 25E to the fourth side surface 25F. The light guide 33L may be formed by arranging a plurality of divided light guides from the third side surface 25E to the fourth side surface 25F. The light guide 33L may be formed by arranging the divided light guides from the third side surface 25E to the fourth side surface 25F and connecting the adjacent light guides to each other.

The light emitters 31 and the light guide 33L are fixed together with an adhesive material or the like and assembled to a support 33M to form a light source module. The support 33M is mounted so as to overlap the first principal surface 25A of the first base member 25 and is fixed to the first base member 25 with an adhesive material or the like.

The wiring substrate 93 (flexible printed circuit board or PCB substrate) is provided with an integrated circuit of the light source controller 32, and the light source controller 32 is coupled to the light source 3 through the wiring substrate 93 (flexible printed circuit board or PCB substrate). The wiring substrate 93 is fixed to the support 33M with an adhesive material or the like.

As illustrated in FIG. 5, the light-source light emitted from the light source 3 propagates in a direction (second direction PY) away from the second side surface 20D while being reflected by any of the first base member 25, the array substrate 10, the counter substrate 20, and the second base member 27.

As illustrated in FIG. 5, the light-source light that has propagated in any of the first base member 25, the array substrate 10, the counter substrate 20, and the second base member 27 is scattered by the pixels Pix including the liquid crystals in the scattering state, and the angle of incidence of the scattered light becomes an angle smaller than the critical angle. Thus, emission light 68 and 68A is emitted outward from the first principal surface 20A of the counter substrate 20 (the first principal surface 25A of the first base member 25) and the first principal surface 10A of the array substrate 10, respectively. The emission light 68 and 68A emitted outward from the first principal surface 20A of the counter substrate 20 and the first principal surface 10A of the array substrate 10, respectively, is viewed by a viewer.

Therefore, as illustrated in FIG. 6, the light emitters 31 are arranged at a predetermined pitch in a region provided in the second direction PY with respect to the active region AA.

As illustrated in FIG. 6, the drive circuit 4 described above includes a plurality of integrated circuits of the gate drive circuit 43 and a plurality of integrated circuits of the source drive circuit 44.

The following describes the polymer-dispersed liquid crystals in the scattering state and the polymer-dispersed liquid crystals in the non-scattering state, using FIGS. 7 to 9.

As illustrated in FIG. 7, the array substrate 10 is provided with a first orientation film AL1. The counter substrate 20 is provided with a second orientation film AL2. When the orientation films are subjected to orientation treatment, for example, the orientation treatment is applied such that the orientation direction of the first orientation film AL1 is oriented toward one side of the first direction PX, and the orientation direction of the second orientation film AL2 is oriented toward the other side of the first direction PX. The first and the second orientation films AL1 and AL2 may be, for example, vertical orientation films, or may be orientation films oriented in the first direction PX in which the light emitters 31 are arranged. The orientation treatment is applied by rubbing treatment or photo-orientation treatment.

The polymer-dispersed liquid crystals LC of the liquid crystal layer 50 illustrated in FIG. 7 are sealed between the array substrate 10 and the counter substrate 20. Then, in a state where the monomer and the liquid crystals are oriented by the first and the second orientation films AL1 and AL2, the monomer is polymerized by ultraviolet rays or heat to form a three-dimensional mesh-like polymer network 51. This process forms the liquid crystal layer 50 including the reverse-mode polymer-dispersed liquid crystals LC in which liquid crystal molecules 52 are dispersed in gaps of the three-dimensional mesh-like polymer network 51 formed in the mesh shape.

Thus, the polymer-dispersed liquid crystals LC include the three-dimensional mesh-like polymer network 51 and the liquid crystal molecules 52.

The orientation of the liquid crystal molecules 52 is controlled by a voltage difference between the pixel electrode PE and the common electrode CE. The voltage applied to the pixel electrode PE changes the orientation of the liquid crystal molecules 52. The degree of scattering of light passing through the pixels Pix changes with change in the orientation of the liquid crystal molecules 52.

For example, as illustrated in FIG. 8, the direction of an optical axis AX1 of the polymer network 51 is substantially equal to the direction of an optical axis AX2 of the liquid crystal molecules 52 when no voltage is applied between the pixel electrode PE and the common electrode CE. The optical axis AX2 of the liquid crystal molecules 52 is parallel to the direction PX (FIG. 1) of the liquid crystal layer 50. The optical axis AX1 of the polymer network 51 is parallel to the direction PX of the liquid crystal layer 50 regardless of whether a voltage is applied.

Ordinary-ray refractive indices of the polymer network 51 and the liquid crystal molecules 52 are equal to each other. When no voltage is applied between the pixel electrode PE and the common electrode CE, the refractive index difference between the polymer network 51 and the liquid crystal molecules 52 is substantially zero in all directions. The liquid crystal layer 50 is placed in the non-scattering state of not scattering the light-source light. The light-source light propagates in a direction away from the light source 3 (the light emitter 31). When the liquid crystal layer 50 is in the non-scattering state of not scattering the light-source light, a background on the first principal surface 20A side of the counter substrate 20 is visible from the first principal surface of the array substrate 10, and a background on the first principal surface 10A side of the array substrate 10 is visible from the first principal surface 20A of the counter substrate 20.

As illustrated in FIG. 9, in the space between the pixel electrode PE and the common electrode CE having a voltage applied thereto, the optical axis AX2 of the liquid crystal molecules 52 is inclined by an electric field generated between the pixel electrode PE and the common electrode CE. Since the optical axis AX1 of the polymer network 51 is not changed by the electric field, the direction of the optical axis AX1 of the polymer network 51 differs from the direction of the optical axis AX2 of the liquid crystal molecules 52. The light-source light is scattered in the pixel Pix including the pixel electrode PE having a voltage applied thereto. As described above, the viewer views a part of the scattered light-source light emitted outward from the first principal surface 10A of the array substrate 10 or the first principal surface 20A of the counter substrate 20.

In the pixel Pix including the pixel electrode PE having no voltage applied thereto, the background on the first principal surface 20A side of the counter substrate is visible from the first principal surface 10A of the array substrate 10, and the background on the first principal surface 10A side of the array substrate 10 is visible from the first principal surface 20A of the counter substrate 20. In the display device 1 of the present embodiment, when the first input signal VS is received from the image transmitter 91, the voltage is applied to the pixel electrode PE of the pixel Pix for displaying an image, and an image based on the third input signal VCSA becomes visible together with the background. In this manner, the image is displayed in the display region when the polymer-dispersed liquid crystals LC are in the scattering state.

The light-source light is scattered in the pixel Pix including the pixel electrode PE having a voltage applied thereto, and emitted outward to display the image, which is displayed so as to be superimposed on the background. In other words, the display device 1 of the present embodiment can display the image so as to be superimposed on the background by combining the emission light 68 or 68A with the background.

A potential of each of the pixel electrodes PE (refer to FIG. 7) written during the one vertical scan period GateScan illustrated in FIG. 3 needs to be held during at least one of the first color light emission period RON, the second color light emission period GON, and the third color light emission period BON after each one vertical scan period GateScan. If the written potential of each of the pixel electrodes PE (refer to FIG. 7) cannot be held during at least one of the first color light emission period RON, the second color light emission period GON, and the third color light emission period BON after each one vertical scan period GateScan, what are called flickers or the like are likely to occur. In other words, in order to shorten the one vertical scan period GateScan serving as a time for selecting the scan lines and increase the visibility in the driving based on what is called the field-sequential system, the written potential of each of the pixel electrodes PE (refer to FIG. 7) is required to be easily held during each of the first color light emission period RON, the second color light emission period GON, and the third color light emission period BON.

Figure 10:
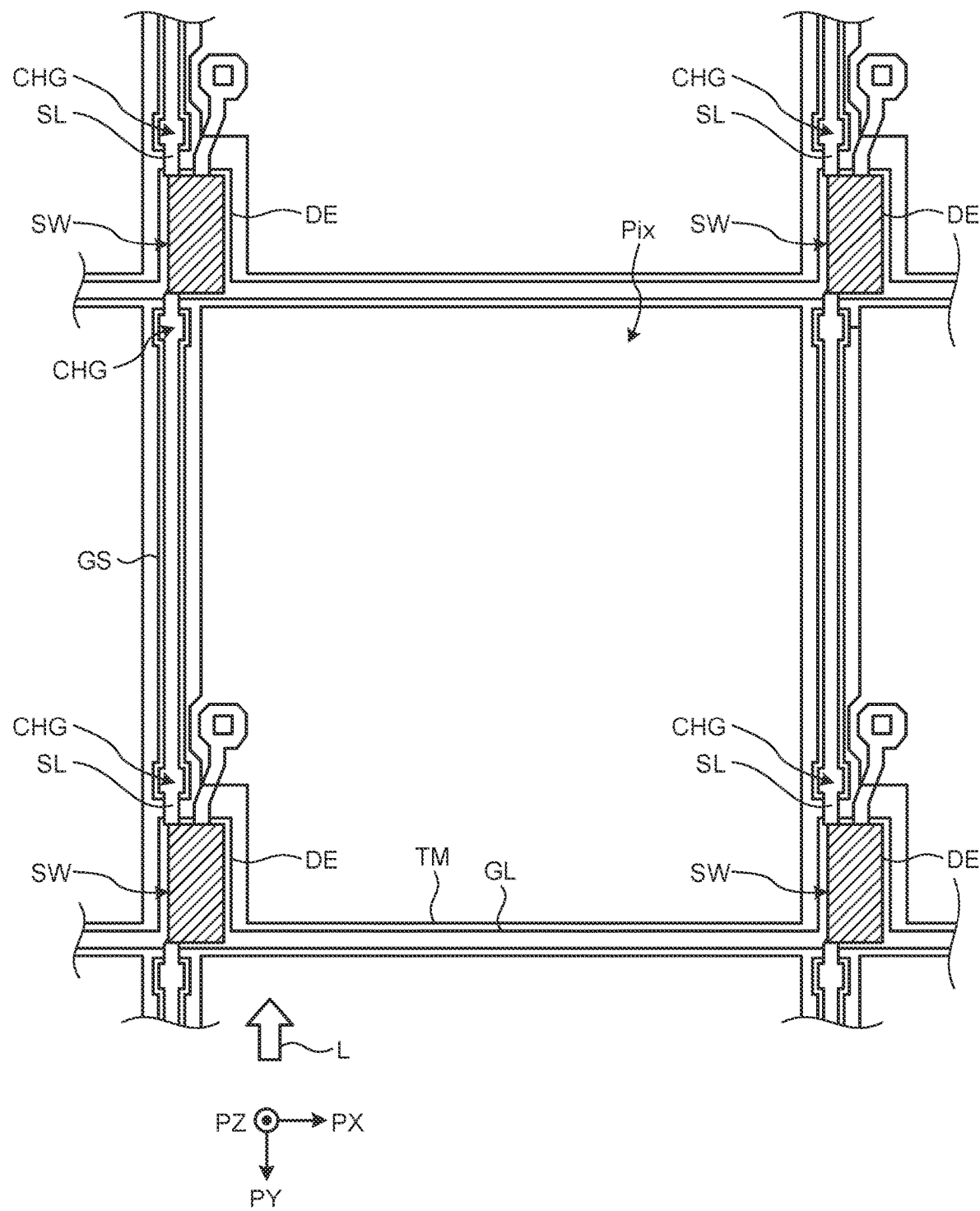
FIG. 10 is a plan view illustrating scan lines, signal lines, and a switching element in the pixel.
Figure 11:
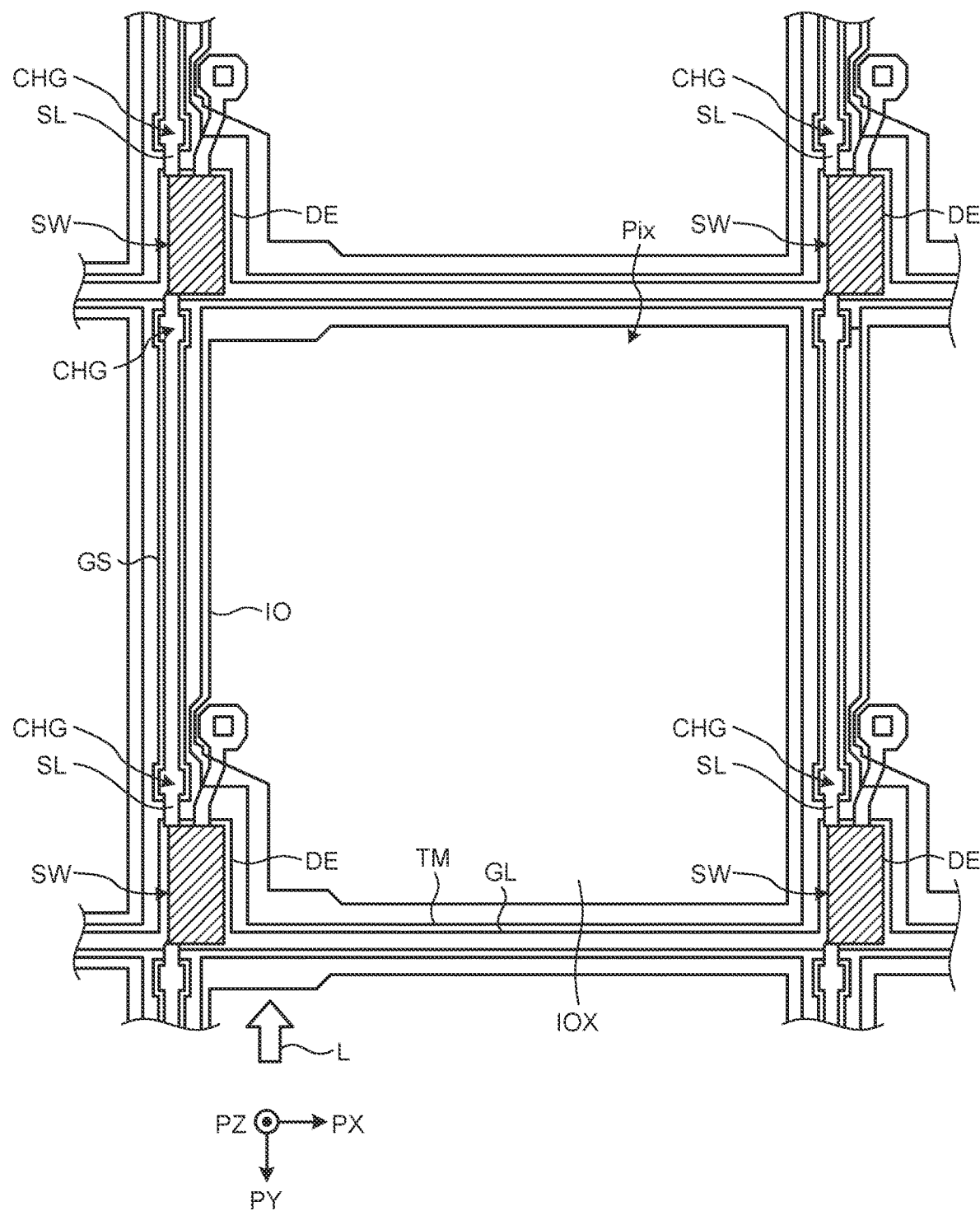
FIG. 11 is a plan view illustrating a holding capacitance layer in the pixel.
Figure 12:
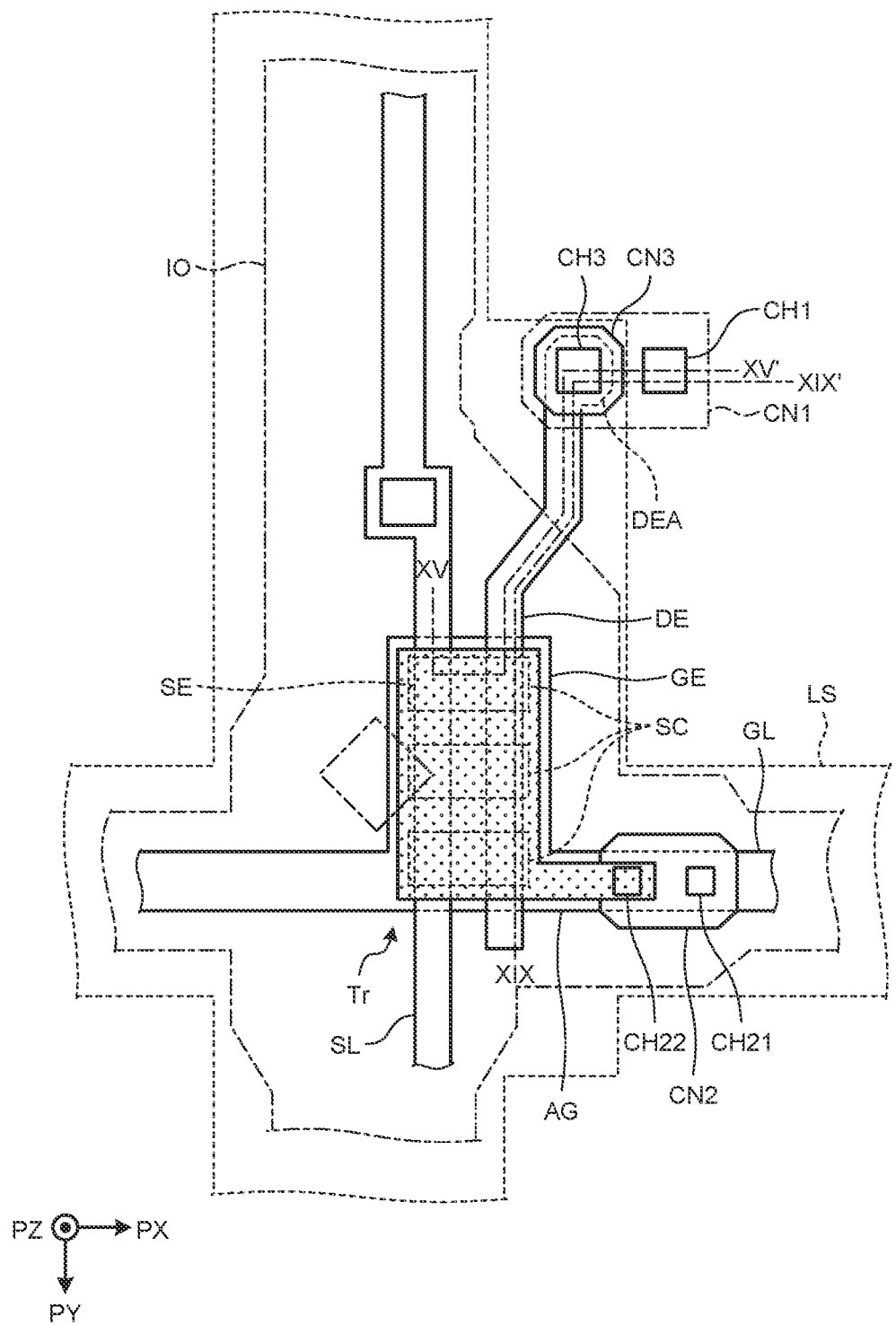
FIG. 12 is a plan view illustrating a switching element placement region in the pixel.
Figure 13:
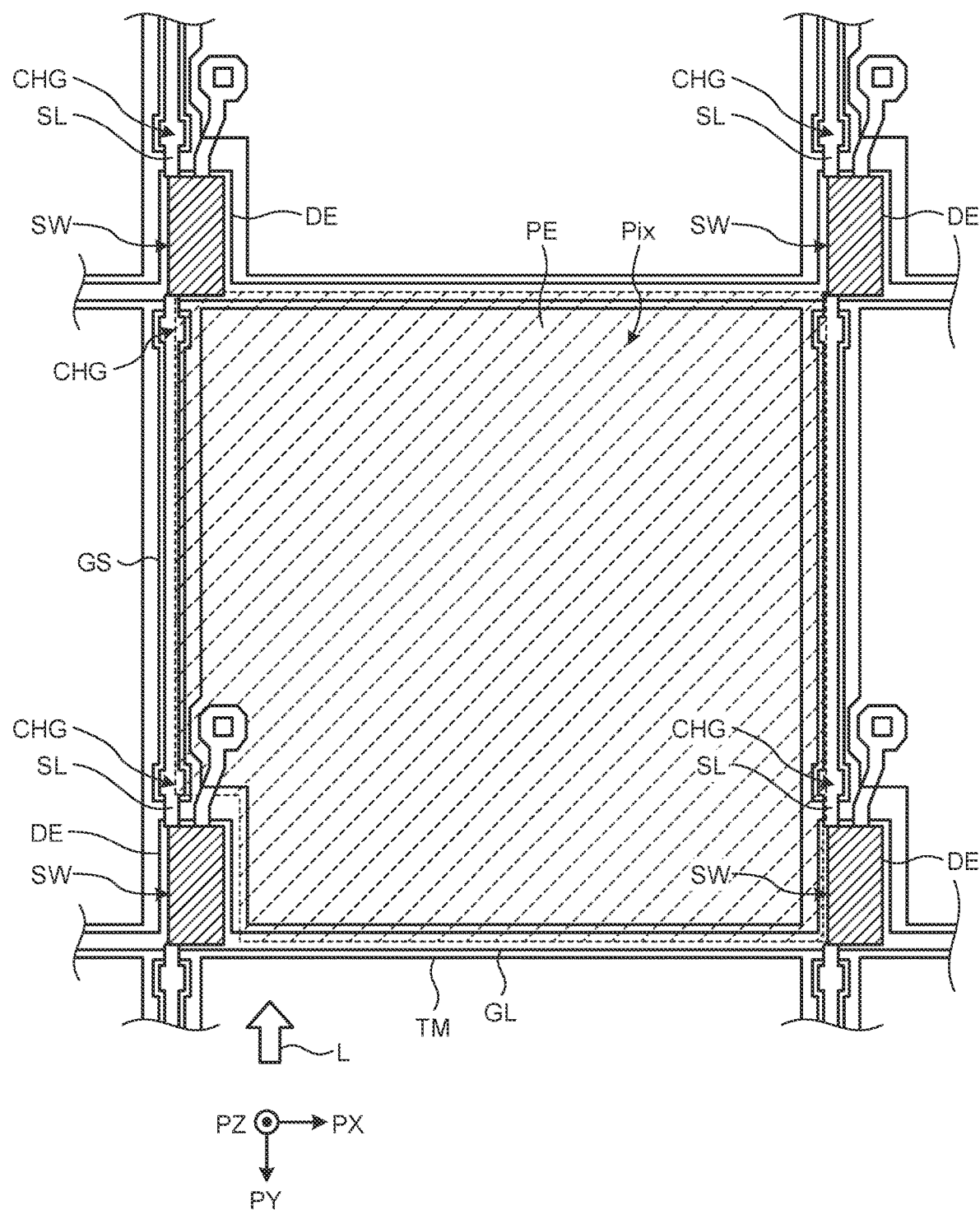
FIG. 13 is a plan view illustrating the pixel electrode in the pixel.
Figure 14:
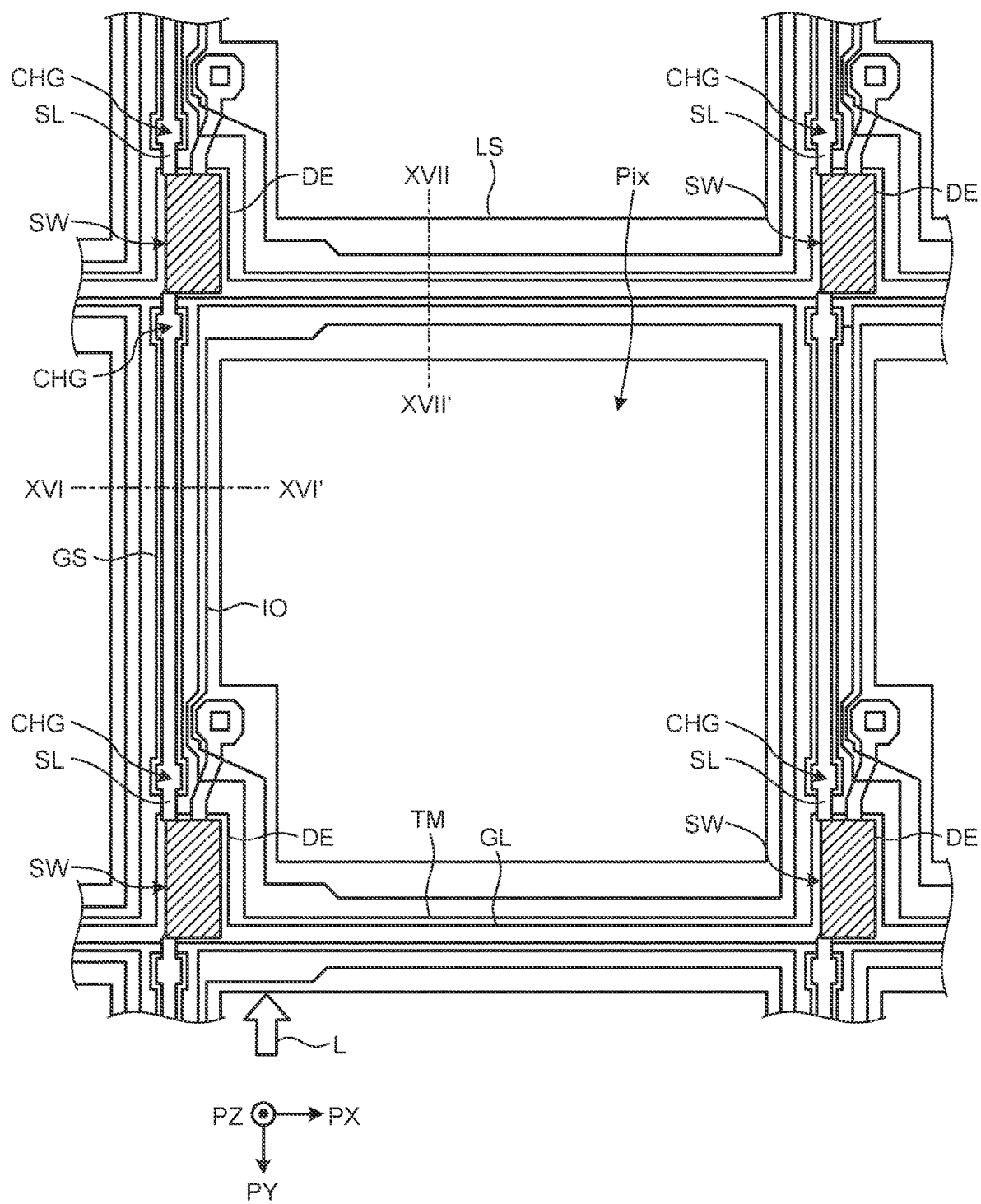
FIG. 14 is a plan view illustrating a light-blocking layer in the pixel.
Figure 15:
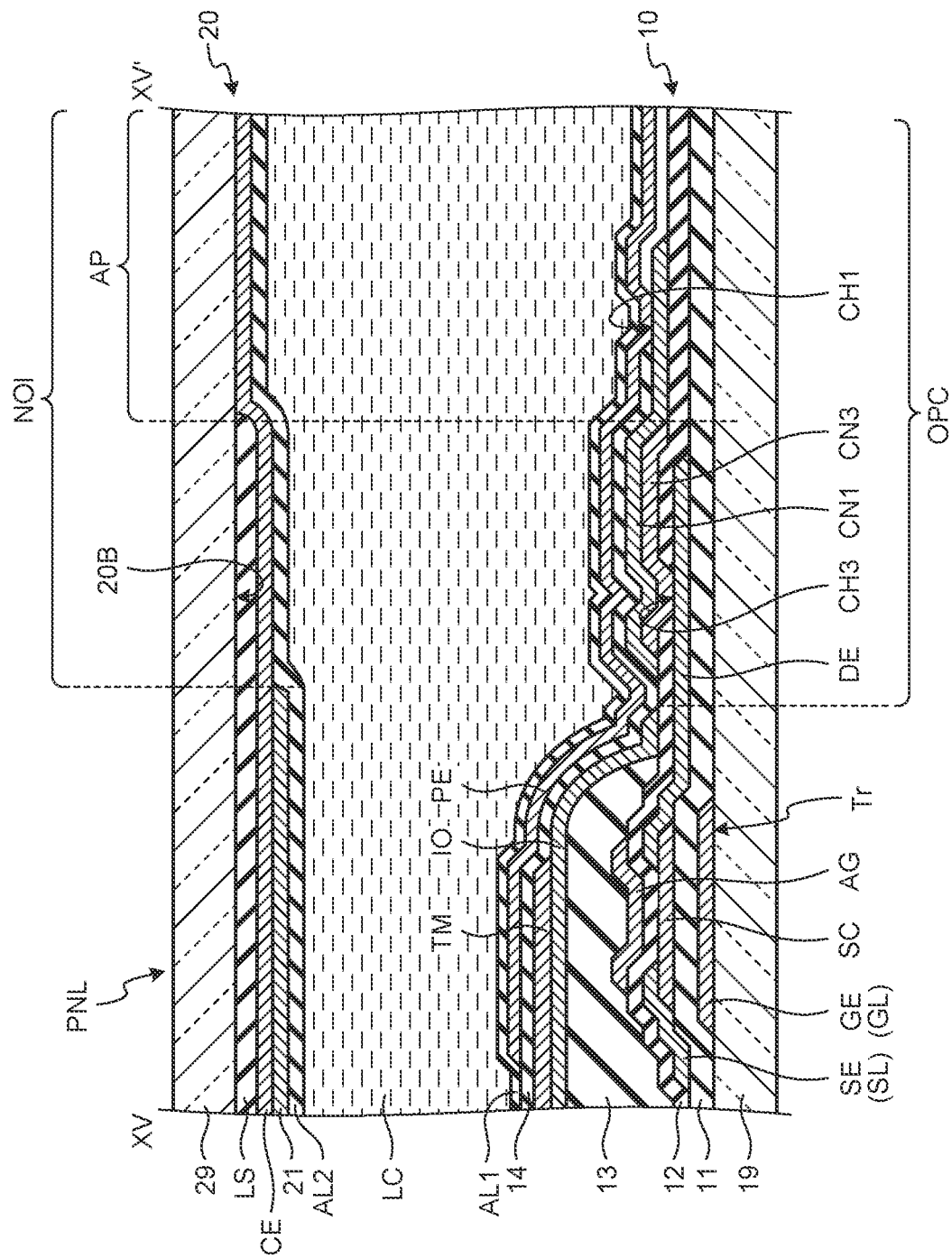
FIG. 15 is a sectional view along XV-XV' of FIG. 12.
Figure 16:
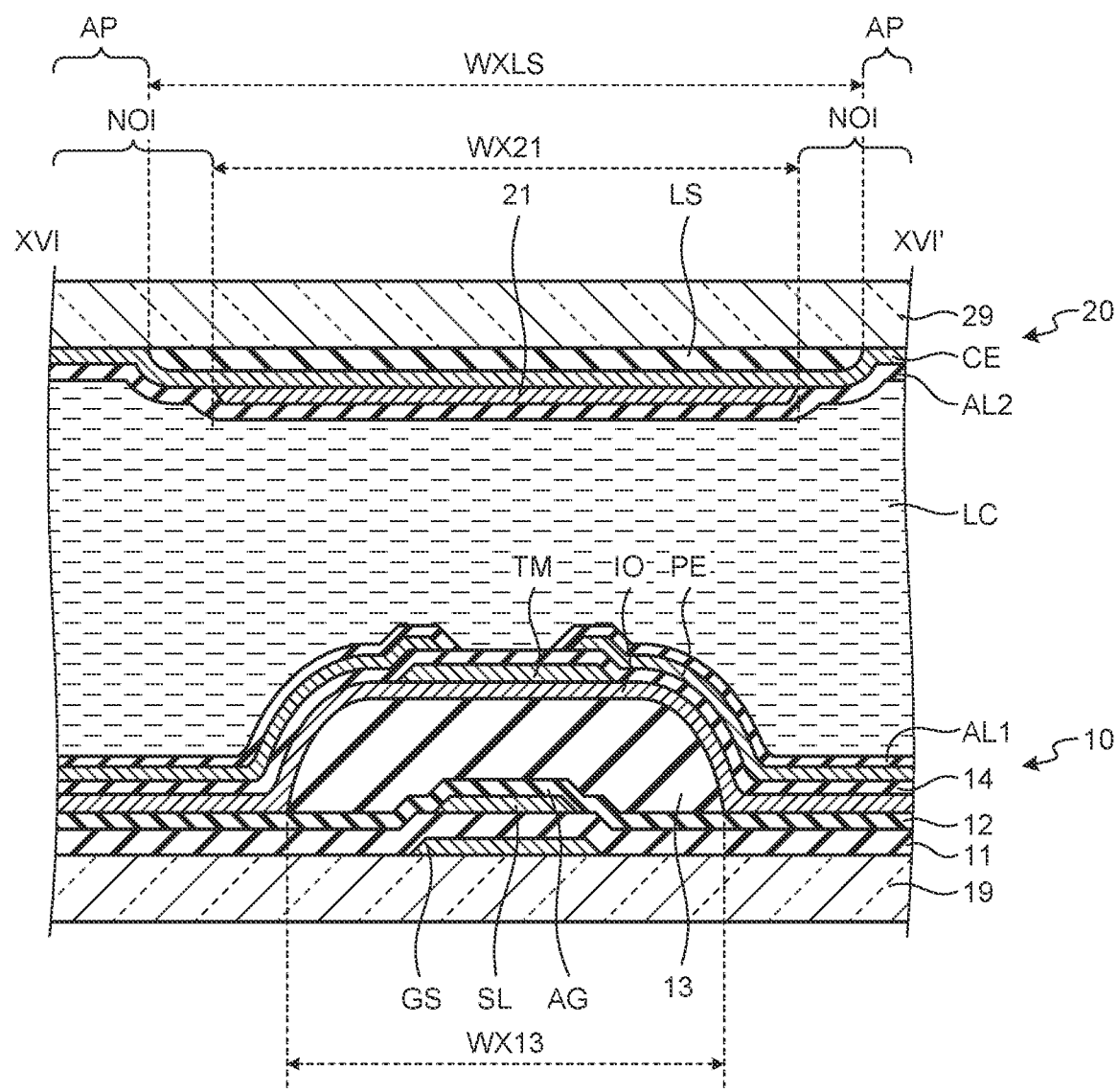
FIG. 16 is a sectional view along XVI-XVI' of FIG. 14.
Figure 17:
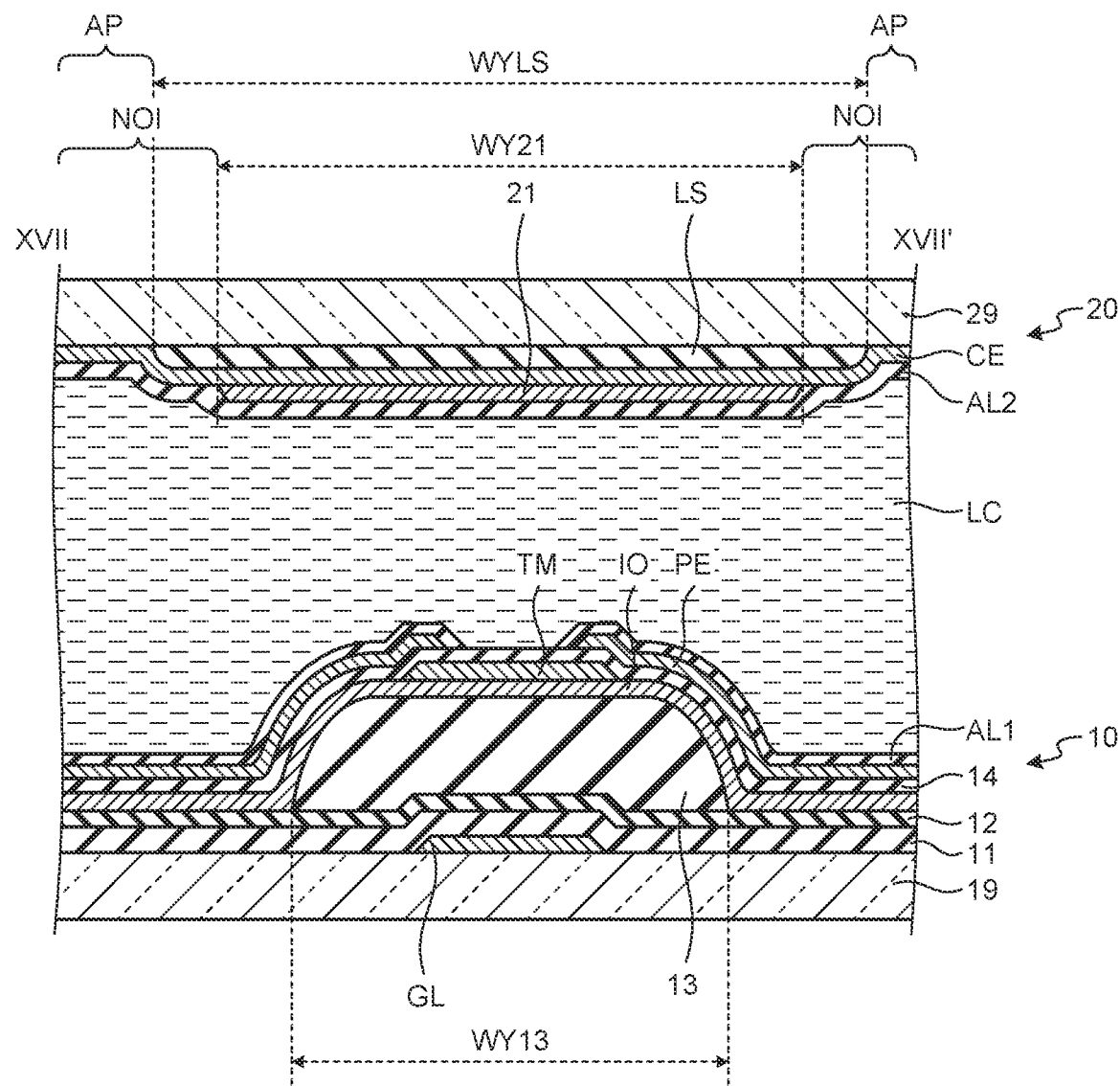
FIG. 17 is a sectional view along XVII-XVII' of FIG. 14.

FIG. 10 is a plan view illustrating the scan lines, the signal lines, and the switching element in the pixel. FIG. 11 is a plan view illustrating a holding capacitance layer in the pixel. FIG. 12 is a plan view illustrating a switching element placement region in the pixel. FIG. 13 is a plan view illustrating the pixel electrode in the pixel. FIG. 14 is a plan view illustrating a light-blocking layer in the pixel. FIG. 15 is a sectional view along XV-XV' of FIG. 12. FIG. 16 is a sectional view along XVI-XVI' of FIG. 14. FIG. 17 is a sectional view along XVII-XVII' of FIG. 14. As illustrated in FIGS. 1, 2, and the array substrate 10 is provided with the signal lines SL and the scan lines GL so as to form a grid in plan view. In other words, one surface of the array substrate is provided with the signal lines arranged at intervals in the first direction PX and the scan lines arranged at intervals in the second direction PY.

As illustrated in FIG. 10, a region surrounded by the adjacent scan lines GL and the adjacent signal lines SL corresponds to the pixel Pix. The pixel Pix is provided with the pixel electrode PE and a switching element placement region SW for the switching element Tr (refer to FIG. 2).

As illustrated in FIG. 10, the scan lines GL are wiring of a metal such as molybdenum (Mo) or aluminum (Al), a multilayered body of these metals, or an alloy thereof. The signal lines SL are wiring of a metal such as aluminum or an alloy thereof.

As illustrated in FIG. 10, light-source light L emitted from the light source 3 (refer to FIG. 5) is incident in the second direction PY serving as a direction of incidence. The direction of incidence refers to a direction from the second side surface 20D closest to the light source 3 (refer to FIG. 5) toward the first side surface 20C that is the opposite surface of the second side surface 20D. When the direction of incidence of the light-source light L is the second direction PY, the length in the first direction PX of the switching element placement region SW is shorter than the length in the second direction PY of the switching element placement region SW. Consequently, the length of the switching element placement region SW in a direction intersecting the direction of incidence of the light-source light L is reduced, and thereby, reducing the effect of the light leakage.

In the present embodiment, the switching element Tr is a bottom-gate thin-film transistor. The switching element Tr includes semiconductors SC overlapping, in plan view, a gate electrode GE electrically coupled to the scan line GL. As illustrated in FIG. 12, the semiconductors SC are provided so as not to extend out from the gate electrode GE in plan view. As a result, the light-source light L traveling toward the semiconductors SC from the gate electrode GE side is reflected, and the light leakage is less likely to occur to the semiconductors SC.

As illustrated in FIG. 12, the switching element Tr includes the semiconductors SC, the gate electrode GE integrated with the scan line GL, a source electrode SE integrated with the signal line SL, a drain electrode DE, and an auxiliary gate electrode AG. The source electrode SE and the drain electrode DE each extend along the second direction PY, and are arranged at an interval along the first direction PX. The source electrode SE is in contact with one end side of each of the semiconductors SC of the switching device Tr. The drain electrode DE is in contact with the other end side of each of the semiconductors SC. The drain electrode DE bends in the middle and extends toward inside the pixel Pix. The drain electrode DE bends in the middle and extends to a contact electrode DEA.

The semiconductor SC is, for example, an oxide semiconductor. The semiconductor SC may be made of polycrystalline silicon or amorphous silicon. The semiconductors SC are arranged at intervals in the second direction PY. For example, three semiconductors SC overlap the gate electrode GE and are arranged at intervals along the second direction PY.

The auxiliary gate electrode AG overlaps the gate electrode GE and semiconductors SC. The semiconductors SC are located between the gate electrode GE and the auxiliary gate electrode AG. The auxiliary gate electrode AG further overlaps the scan line GL. The auxiliary gate electrode AG need not be provided, in a case where the gate electrode GE is provided.

A coupling electrode CN2 is interposed between the scan line GL and the auxiliary gate electrode AG and electrically couples them together. Specifically, a contact hole CH21 is formed in an insulating film interposed between the scan line GL and the coupling electrode CN2. The coupling electrode CN2 is in contact with the scan line GL at the contact hole CH21. A contact hole CH22 is formed in an insulating film interposed between the coupling electrode CN2 and the auxiliary gate electrode AG. The auxiliary gate electrode AG is in contact with the coupling electrode CN2 at the contact hole CH22. With this configuration, the auxiliary gate electrode AG is electrically coupled to the scan line GL in the same manner as the gate electrode GE. As a result, the potentials of the gate electrode GE and the auxiliary gate electrode AG are the same as that of the scan line GL.

The contact electrode DEA at one end of the drain electrode DE is located inside an opening AP (refer to FIG. 15) of the pixel Pix, and overlaps a coupling electrode CN3. A contact hole CH3 is formed in an insulating film interposed between the drain electrode DE and the coupling electrode CN3. The drain electrode DE is in contact with the coupling electrode CN3 at the contact hole CH3.

A coupling electrode CN1 is in contact with the coupling electrode CN3. With this configuration, the coupling electrode CN1 is electrically coupled to the switching element Tr and electrically coupled to the pixel electrode PE illustrated in FIG. 13 at a contact hole CH1. The coupling electrode CN1 is a light-transmitting electrode formed of the same material as that of the holding capacitance electrode IC, and the drain electrode DE and coupling electrode CN3 are formed of a metal material.

In plan view, the contact hole CH1 is formed at a location overlapping neither the drain electrode DE nor the coupling electrode CN3. The contact holes CH3 and CH1 are arranged in the first direction PX. The drain electrode DE and the contact hole CH1, or the coupling electrode CN3 and the contact hole CH1, are arranged in the first direction PX. The contact hole CH3, the drain electrode DE, and the coupling electrode CN3 are located between the holding capacitance electrode IC and the contact hole CH1 in the first direction PX.

As illustrated in FIG. 12, in plan view, a light-blocking layer LS overlaps the drain electrode DE, the coupling electrode CN3, and the contact hole CH3, but does not overlap the contact hole CH1. The contact hole CH1 is located in the opening AP of the light-blocking layer LS. A portion of the coupling electrode CN1 that overlaps the drain electrode DE and the coupling electrode CN3 formed of the metal material overlaps the light-blocking layer LS. The other portion of the coupling electrode CN1 overlaps the opening AP of the light-blocking layer LS.

As illustrated in FIG. 14, the light-blocking layer LS is provided in a grid pattern in plan view so as to overlap the signal lines SL and the scan lines GL. The opening AP of the light-blocking layer LS is a smaller area than an opening surrounded by the scan lines GL and the signal lines SL.

As illustrated in FIG. 15, the array substrate 10 includes a first light-transmitting base member 19 formed of glass, for example. The first light-transmitting base member 19 may be made of a resin such as polyethylene terephthalate, as long as having a light transmitting capability.

As illustrated in FIG. 15, the scan line GL (refer to FIG. 10) and the gate electrode GE are provided on the first light-transmitting base member 19.

As illustrated in FIG. 15, a first insulating layer 11 is also provided so as to cover the scan line GL and the gate electrode GE. The first insulating layer 11 is formed, for example, of a transparent inorganic insulating material such as silicon nitride.

The semiconductor SC is stacked on the first insulating layer 11.

The source electrode SE and the signal line SL covering a portion of the semiconductor SC and the drain electrode DE covering another portion of the semiconductor SC are provided on the first insulating layer 11. The drain electrode DE is formed of the same material as that of the signal line SL. A second insulating layer 12 is provided on the semiconductor SC, the signal line SL, and the drain electrode DE. The second insulating layer 12 is formed, for example, of a transparent inorganic insulating material such as silicon nitride, in the same manner as the first insulating layer 11.

A third insulating layer 13 covering a portion of the second insulating layer 12 is formed on the second insulating layer 12. The third insulating layer 13 is an organic insulating layer formed, for example, of a light-transmitting organic insulating material such as an acrylic resin. The third insulating layer 13 has a film thickness greater than other insulating films formed of an inorganic material.

As illustrated in FIGS. 15, 16, and 17, some regions have the third insulating layer 13 while the other regions do not have the third insulating layer 13. As illustrated in FIGS. 16 and 17, the regions having the third insulating layer 13 are located over the scan lines GL and over the signal lines SL. The third insulating layer 13 has a grid shape along the scan lines GL and the signal lines SL and covers over the scan lines GL and the signal lines SL. As illustrated in FIG. 15, the regions having the third insulating layer 13 are also located over the semiconductor layer SC, that is, over the switching elements Tr. As a result, the switching element Tr, the scan line GL, and the signal line SL are located at relatively long distances from the holding capacitance electrode IC, and are thereby less affected by a common potential from the holding capacitance electrode IC. In addition, regions on the array substrate 10 not having the third insulating layer 13 are provided in the regions surrounded by the scan lines GL and the signal lines SL. Thus, regions are provided in which the thickness of the insulating layer is less than the thickness of the insulating layer overlapping the signal lines SL and the scan lines GL in plan view. The regions surrounded by the scan lines GL and the signal lines SL have relatively higher optical transmittance than the regions over the scan lines GL and over the signal lines SL, and thus, are improved in light transmitting capability.

As illustrated in FIG. 15, the holding capacitance electrode IO is provided on the third insulating layer 13. The holding capacitance electrode IO is formed of a light-transmitting conductive material such as indium tin oxide (ITO). The holding capacitance electrode IO is also called a "third light-transmitting electrode". As illustrated in FIG. 11, the holding capacitance electrode IO has a region IOX including no light-transmitting conductive material in each of the regions surrounded by the scan lines GL and the signal lines SL. The holding capacitance electrode IO extends across the adjacent pixels Pix and is provided over the pixels Pix. A region of the holding capacitance electrode IO including the light-transmitting conductive material overlaps the scan line GL or the signal line SL, and extends to the adjacent pixel Pix.

The coupling electrode CN1 is separate from the holding capacitance electrode IO and is located above the second insulating layer 12 at an opening of the third insulating layer 13 or at an opening OPC of the holding capacitance electrode IO. The holding capacitance electrode IO and the coupling electrode CN1 are located in substantially the same layer and are formed of the same material. The coupling electrode CN1 is located above the coupling electrode CN3 and is in contact with the coupling electrode CN3.

As illustrated in FIG. 15, a metal layer TM is provided on the upper side of the third insulating layer 13 and the holding capacitance electrode IO. The conductive metal layer TM is wiring of a metal such as molybdenum (Mo) or aluminum (Al), a multilayered body of these metals, or an alloy thereof. Since the metal layer TM has lower resistance than that of the holding capacitance electrode IO, the pixel-to-pixel variation of the holding capacitance of each pixel Pix decreases. As illustrated in FIG. 10, the metal layer TM is provided in a region overlapping the signal lines SL, the scan lines GL, and the switching elements Tr in plan view. With this configuration, the metal layer TM is formed into a grid shape, and openings surrounded by the metal layer TM are formed. Thus, the metal layer TM serves as feeder lines that feed the potential of the holding capacitance.

The holding capacitance electrode IO has a grid shape that covers over the scan lines GL and the signal lines SL along the scan lines GL and the signal lines SL. This configuration reduces the holding capacitance HC between the region IOX including no light-transmitting conductive material and the pixel electrode PE. Therefore, the holding capacitance HC is adjusted by the size of the region IOX including no light-transmitting conductive material.

As illustrated in FIG. 12, the switching element Tr coupled to the scan line GL and the signal line SL is provided. At least the switching element Tr is covered with the third insulating layer 13 serving as an organic insulating layer, and the metal layer TM having a larger area than that of the switching element Tr is located above the third insulating layer 13. This configuration can reduce the light leakage of the switching element Tr.

More specifically, the array substrate 10 includes the third insulating layer 13 and the metal layer TM. The third insulating layer 13 serves as an organic insulating layer that covers at least the switching element Tr, and the metal layer TM is provided above the third insulating layer 13 so as to overlap the third insulating layer 13 and has a larger area than that of the switching element Tr. The region surrounded by the scan lines GL and the signal lines SL has a region having a thickness less than that of the third insulating layer 13 that overlaps the scan lines GL, and the signal lines SL in plan view. This configuration forms a slant surface along which the thickness of the third insulating layer 13 changes, the slant surface being located on a side of the third insulating layer 13 closer, in plan view, to the light source 3 than the switching element Tr is.

As illustrated in FIGS. 13, 15, 16, and 17, a portion of the pixel electrode PE overlaps the slant surface where the thickness of the third insulating layer 13 changes. This configuration stabilizes the behavior of the liquid crystal molecules between the adjacent pixels Pix.

As illustrated in FIG. 16, in plan view, the width of the metal layer TM overlapping the signal line SL is greater than the width of the signal line SL. This configuration reduces the emission of reflected light reflected by edges of the signal line SL from the display panel 2. The width of the metal layer TM and the width of the signal line SL are lengths in a direction intersecting the extending direction of the signal line SL.

As illustrated in FIG. 17, the width of the metal layer TM overlapping the scan line GL is greater than the width of the scan line GL. The width of the metal layer TM and the width of the scan line GL are lengths in a direction intersecting the extending direction of the scan line GL.

As illustrated in FIG. 15, a fourth insulating layer 14 is provided on the upper side of the holding capacitance electrode IO and the metal layer TM. The fourth insulating layer 14 is an inorganic insulating layer formed, for example, of a transparent inorganic insulating material such as silicon nitride.

As illustrated in FIG. 15, the pixel electrode PE is provided on the fourth insulating layer 14. The pixel electrode PE is formed of a light-transmitting conductive material such as ITO. The pixel electrode PE is electrically coupled to the contact electrode DEA through the contact holes CH1 and CH3 provided in the fourth insulating layer 14 and the second insulating layer 12. As illustrated in FIG. 13, the pixel electrode PE is partitioned for each of the pixels Pix. The first orientation film AL1 is provided on the upper side of the pixel electrode PE.

As illustrated in FIGS. 10 and 16, in the display device of the first embodiment, a light-blocking layer GS located in the same layer as that of the scan line GL is provided at a location extending along the signal line SL and overlapping a portion of the signal line SL. The light-blocking layer GS is formed of the same material as that of the scan line GL. The light-blocking layer GS is not provided at a portion where the scan line GL intersects the signal line SL in plan view.

As illustrated in FIG. 10, the light-blocking layer GS is electrically coupled to the signal line SL through a contact hole CHG. With this configuration, the wiring resistance obtained by combining the light-blocking layer GS with the signal line SL is lower than that of only the signal line SL. As a result, the delay of the gradation signal supplied to the signal line SL is reduced. The contact hole CHG may not be provided, and the light-blocking layer GS may not be coupled to the signal line SL.

As illustrated in FIG. 16, the light-blocking layer GS is provided opposite to the metal layer TM with the signal line SL therebetween. The width of the light-blocking layer GS is greater than that of the signal line SL and less than that of the metal layer TM. The width of the light-blocking layer GS, the width of the metal layer TM, and the width of the signal line SL are lengths in a direction intersecting the extending direction of the signal line SL. In this manner, the light-blocking layer GS has a width greater than that of the signal line SL, and thus, restrains the reflected light reflected by the edges of the signal line SL from being emitted from the display panel 2. As a result, the visibility of images is improved in the display device 1.

As illustrated in FIGS. 14 and 15, the counter substrate 20 is provided with the light-blocking layer LS. The light-blocking layer LS is provided in a region overlapping the signal lines SL, the scan lines GL, and the switching elements Tr in plan view.

As illustrated in FIGS. 14, 15, 16, and 17, the light-blocking layer LS has a width greater than that of the metal layer TM. This configuration restrains reflected light reflected by edges of the signal line SL, the scan line GL, and the metal layer TM from being emitted from the display panel 2. As a result, the visibility of images is improved in the display device 1.

Figure 18:
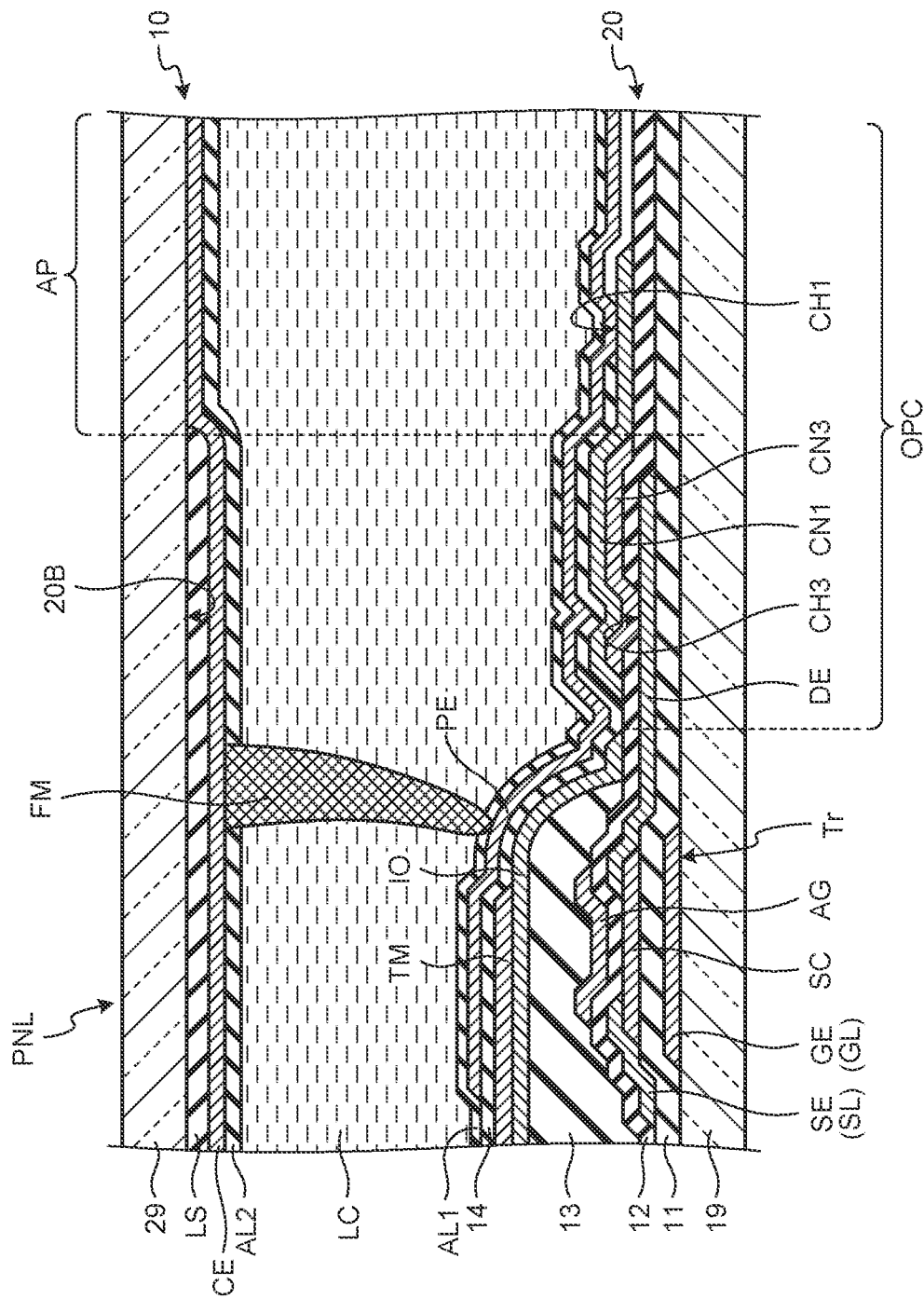
FIG. 18 is a sectional view for explaining a display device of a comparative example.

FIG. 18 is a sectional view along XV-XV' of FIG. 12 according to a comparative example. A display device of the comparative example illustrated in FIG. 18 does not include a protective film 21. As illustrated in FIG. 18, if conductive foreign matter FM reaches the periphery of the third insulating layer 13, the foreign matter FM may break the first and the second orientation films AL1 and AL2 and a short circuit between the pixel electrode PE and the common electrode CE located above the third insulating layer 13 may occur. When the pixel electrode PE covers an edge of the third insulating layer 13 as illustrated in FIG. 18, the foreign matter FM may break the first orientation film AL1 covering the pixel electrode PE.

The display device 1 of the first embodiment includes the protective film 21 in the counter substrate 20. The protective film 21 is more difficult to be broken by the foreign matter FM than the first and the second orientation films AL1 and AL2 are. Even if the first orientation film AL1 covering the pixel electrode PE is broken by the foreign matter FM, the occurrence of short circuit between the pixel electrode PE and the common electrode CE is reduced as long as the protective film 21 is not broken by the foreign matter FM.

Figure 19:
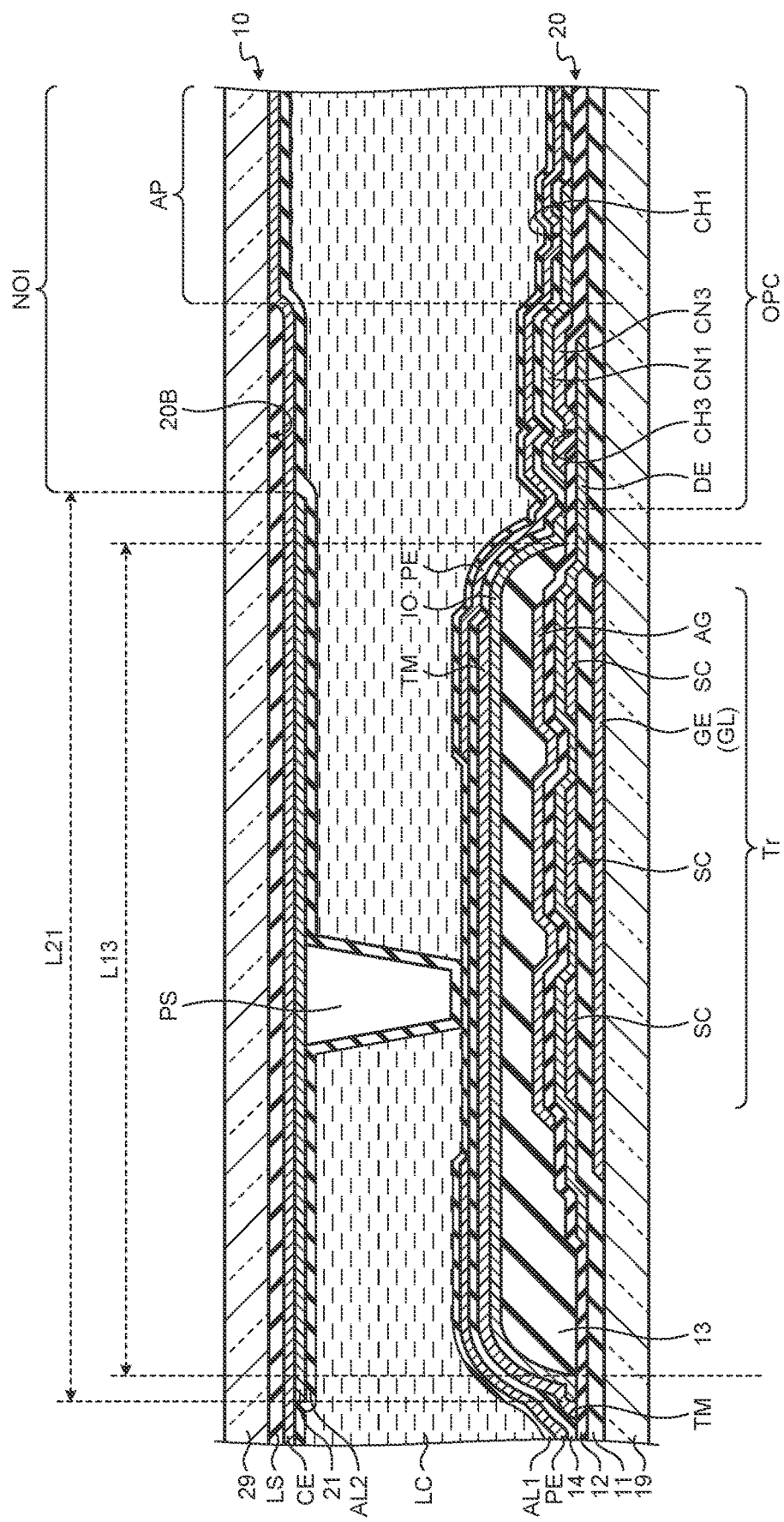
FIG. 19 is a sectional view along XIX-XIX' of FIG. 12.

FIG. 19 is a sectional view along XIX-XIX' of FIG. 12. Specifically, the counter substrate 20 illustrated in FIGS. 15 and 19 includes a second light-transmitting base member 29 formed of glass, for example. The second light-transmitting base member 29 may be made of a resin such as polyethylene terephthalate, as long as having a light transmitting capability. The common electrode CE is provided on the second principal surface 20B of the second light-transmitting base member 29. The common electrode CE is formed of a light-transmitting conductive material such as ITO. The protective film 21 is formed of an inorganic insulating material having an insulating capability and a light transmitting capability, such as silicon nitride or silicon oxide, that covers the array substrate 10 side of the common electrode CE. The second orientation film AL2 is provided on the array substrate 10 side of the protective film 21. The protective film 21 may be a light-blocking inorganic insulating film.

Figure 20:
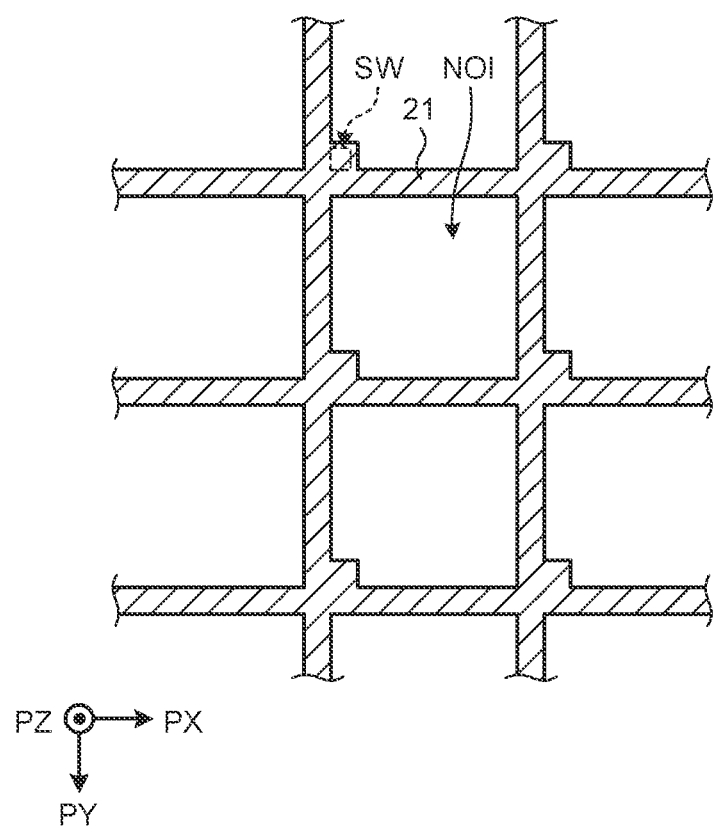
FIG. 20 is a plan view for explaining a shape of a protective film in plan view.

As illustrated in FIGS. 15, 16, 17, and 19, the protective film 21 is formed at a location overlapping the third insulating layer 13. In a region overlapping the opening AP, the common electrode CE and the second orientation film AL2 are directly stacked without interposing the protective film 21 therebetween. As a result, as illustrated in FIG. 20, the planar shape of the protective film 21 is formed into a grid shape, thus creating non-overlapping regions NCI of the protective film 21. The protective film 21 is not formed in the opening AP.

As illustrated in FIG. 16, a width WX21 of the protective film 21 is equal to or larger than a width WX13 of the third insulating layer 13 and equal to or smaller than a width WXLS of the light-blocking layer LS. As illustrated in FIG. 17, the width WY21 of the protective film 21 is equal to or larger than the width WY13 of the third insulating layer 13 and equal to or smaller than the width WYLS of the light-blocking layer LS. As illustrated in FIG. 20, the protective film 21 having a larger area than that of the switching element placement region SW is provided above the third insulating layer 13 covering the switching element Tr and overlaps the third insulating layer 13. As a result, as illustrated in FIG. 19, in a section where the switching element placement region SW is present, a length L21 of the protective film 21 is longer than a length L13 of the third insulating layer 13 covering the switching element Tr.

The thickness of the protective film 21 is from 50 nm to 400 nm. The thickness of the protective film 21 is equal to or larger than the thickness of the common electrode CE. If the thickness of the protective film 21 is smaller than 50 nm, foreign matter is likely to easily penetrate the protective film 21. If the thickness of the protective film 21 exceeds 400 nm, the light transmission from one side of the display panel 2 to the other side of the display panel 2 opposite thereto is likely to decrease. If the thickness of the protective film 21 exceeds 400 nm, the effect of the dielectric constant of the protective film 21 increases, and thus, the effective voltage between the common electrode CE and the pixel electrode PE may decrease.

The counter substrate 20 includes the light-blocking layer LS between the second light-transmitting base member 29 and the common electrode CE. The light-blocking layer LS is formed of a resin or a metal material colored in black.

As illustrated in FIG. 19, a spacer PS is formed between the array substrate 10 and the counter substrate 20. The spacer PS is sandwiched between the protective film 21 and the second orientation film AL2 and is in contact with the protective film 21. The thickness of the spacer PS can be reduced by the thickness of the third insulating layer 13, and therefore, can be from 1 μm to 4 μm. As a result, the distance between the top of the third insulating layer 13 and the counter substrate 20 decreases. The spacer PS is formed of an organic insulator of an acrylic resin or an ethylene resin, for example. As a result, the spacer PS has a light-transmitting capability, and therefore, is less likely to block light. Since the spacer SP is disposed between the array substrate 10 and the counter substrate 20, the uniformity of the distance between the array substrate 10 and the counter substrate 20 is improved. The protective film 21 may not be provided between the spacer PS and the common electrode CE.

Evaluation Example

Display panels of the same size in each of which the conductive foreign matter FM is sealed in the liquid crystal layer 50 were manufactured as Comparative Example 1, Comparative Example 2, Comparative Example 3, Example 1, and Example 2.

Comparative Example 1 is a display device having a structure illustrated in FIG. 18 that does not include the protective film 21. Comparative Examples 2 and 3 include the protective film 21. In Comparative Examples 2 and 3, the region provided with the protective film 21 overlaps not only the third insulating layer 13 but also the opening surrounded by the scan lines GL and the signal lines SL. The thickness of the protective film 21 in Comparative Example 2 is 50 nm, and the thickness of the protective film 21 in Comparative Example 3 is 200 nm.

Examples 1 and 2 include the protective film 21. In Examples 1 and 2, the region provided with the protective film 21 illustrated in FIG. 20 is a portion overlapping the third insulating layer 13, and the protective film 21 does not overlap the opening surrounded by the scan lines GL and the signal lines SL. The thickness of the protective film 21 in Example 1 is 50 nm, and the thickness of the protective film 21 in Example 2 is 200 nm.

Comparative Examples 1, 2, and 3, and Examples 1 and 2 were checked for presence of dark spots. For Comparative Examples 1, 2, and 3, and Examples 1 and 2, when the light source 3 emitted light at a constant light quantity and the same white window image was displayed, the central luminance of the display panel was measured at the same location.

For Comparative Examples 1, 2, and 3, and Examples 1 and 2, when the light source 3 emitted light at a constant light quantity and the same white window image was displayed, the percentage of the luminance of the active region AA closest to the second side surface 20D to that of the active region AA closest to the first side surface 20C was measured as a luminance gradient. The uniformity is obtained as 100—luminance gradient (%). The luminance gradient refers to a degree of non-uniformity in luminance in the luminance distribution between a side closer to the light source 3 and the opposite side of the light source 3 (location farther from the light source 3) that occurs due to a tendency that the degree of scattering of light is higher at locations closer to the light source 3 and lower on the opposite side of the light source 3. The evaluation results are illustrated in Table 1.

TABLE 1

|  | Comparative Example 1 | Comparative Example 2 | Comparative Example 3 | Example 1 | Example 2 |
|---|---|---|---|---|---|
| Protective Film Thickness | — | 50 nm | 200 nm | 50 nm | 200 nm |
| Central Luminance (cd/m²) | 250 | 120 | 70 | 245 | 240 |
| Luminance Gradient (Uniformity) | 55% (45%) | 68% (32%) | 76% (24%) | 57% (43%) | 58% (42%) |
| Dark Spots | Present | None | None | None | None |

According to Table 1, the protective film 21 has an effect to reduce the dark spots caused by the conductive foreign matter. Comparing the first embodiment with Comparative Example 2, the protective film 21 located in the opening surrounded by the scan lines GL and the signal lines SL reduces the central luminance, thus causing the luminance gradient to reduce the uniformity. Comparing Comparative Example 2 with Comparative Example 3, the central luminance decreases and the uniformity decreases as the thickness of the protective film 21 increases. Comparing Example 1 with Example 2, the rate of change in the central luminance and the rate of decrease in the uniformity due to the increase in the thickness of the protective film 21 are restrained to be smaller than those in the comparative examples.

As described above, the display device 1 includes the array substrate 10, the counter substrate 20, and the liquid crystal layer 50. The array substrate 10 includes the pixel electrodes PE that are first light-transmitting electrodes arranged for the respective pixels Pix. The array substrate 10 is provided with the signal lines SL arranged at intervals in the first direction PX and the scan lines GL arranged at intervals in the second direction PY. The counter substrate 20 includes a common electrode CE that is a second light-transmitting electrode at a location overlapping the pixel electrodes PE in plan view. The protective film 21 covers the array substrate 10 side of the common electrode CE that at least partially overlaps the third insulating layer 13. The liquid crystal layer 50 includes the polymer-dispersed liquid crystals LC that are sealed between the array substrate 10 and the counter substrate 20. The second orientation film covers the protective film 21 and the common electrode CE. The region overlapping the opening surrounded by the scan lines GL and the signal lines SL has each of the non-overlapping regions NCI of the protective film 21 where the common electrode CE and the second orientation film AL2 are directly stacked without interposing the protective film 21 therebetween.

This configuration reduces the occurrence of short circuit between the pixel electrode PE and the common electrode CE caused by the foreign matter. For example, when the protective film 21 is formed of silicon nitride, the refractive index of silicon nitride is approximately 1.9. The light-source light emitted from the light source 3 is reflected a number of times by any of the first base member 25, the array substrate 10, the counter substrate 20, and the second base member 27 while propagating in the direction away from the second side surface 20D (in the second direction PY). As a result, in Comparative Examples 1 and 2 described above, each time the light-source light passes through the protective film 21 a number of times, the luminance of the light-source light decreases and the luminance gradient increases. In contrast, in Examples 1 and 2, the number of times the light-source light passes through the protective film 21 is reduced by virtue of the non-overlapping region NCI of the protective film 21, thus making the luminance of the light-source light more difficult to decrease. In this manner, the non-overlapping region NCI of the protective film 21 can improve the luminance of the display device 1 and reduce the luminance gradient. As a result, the uniformity of the luminance distribution in the plane of the display device 1 is improved.

As illustrated in FIG. 16, the protective film 21 is provided above the slant surface of the covering over the signal line SL and overlaps the third insulating layer 13. As illustrated in FIG. 17, the protective film 21 is provided above the slant surface of the third insulating layer 13 covering over the scan line GL and overlaps the slant surface. This configuration forms the shape of the protective film 21 in plan view into a grid shape. As a result, the occurrence of short circuit between the pixel electrode PE and the common electrode CE caused by the foreign matter FM can be reduced in regions where the distance between the array substrate 10 and the counter substrate 20 is smaller.

In the region surrounded by the scan lines GL and the signal lines SL, the switching element Tr is provided, and at least the switching element Tr is covered by the third insulating layer 13, and the protective film 21 having a larger area than that of the switching element placement region SW is provided above the third insulating layer 13 and overlaps the third insulating layer 13. As a result, the occurrence of short circuit between the pixel electrode PE and the common electrode CE caused by the foreign matter FM can be reduced in regions where the distance between the array substrate 10 and the counter substrate 20 is smaller.

Second Embodiment

Figure 21:
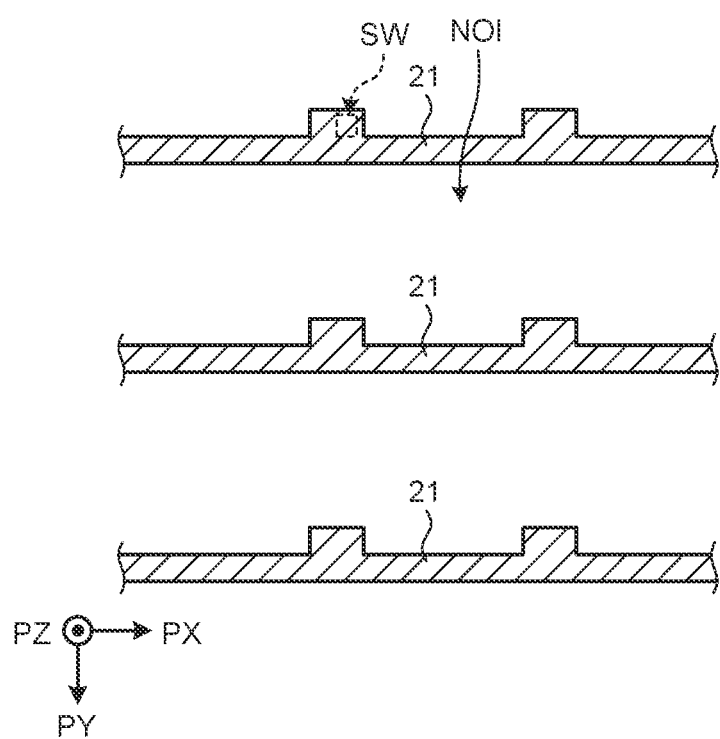
FIG. 21 is a plan view for explaining the shape of the protective film in plan view according to a second embodiment of the present disclosure.

FIG. 21 is a plan view for explaining the shape of the protective film in plan view according to a second embodiment of the present disclosure. The same components as those described in the embodiment described above are denoted by the same reference numerals, and the description thereof will not be repeated.

In the first embodiment, as illustrated in FIG. 14, the light-blocking layer LS is provided in a grid pattern in plan view so as to overlap the signal lines SL and the scan lines GL. Portions of the light-blocking layer LS extending parallel to the direction of incidence of the light-source light L can be omitted because such portions reflect only a small amount of the light-source light L. In this case, the light-blocking layer LS includes only portions extending in the first direction PX. This configuration reduces the area of the light-blocking layer LS, and thus improves the transmittance of the display device 1. When the light-blocking layer LS includes only the portions extending in the first direction PX, the protective film 21 also includes only portions extending in the first direction PX, as illustrated in FIG. 21. With this configuration, in the portion where the protective film 21 is provided, even if the first orientation film AL1 covering the pixel electrode PE is broken by the foreign matter FM, the occurrence of short circuit between the pixel electrode PE and the common electrode CE is reduced as long as the protective film 21 is not broken by the foreign matter FM. If the direction of incidence of the light-source light L is changed to the first direction PX and the light-blocking layer LS is formed to include only the portions extending in the second direction PY, the protective film 21 may be formed to include only the portions extending in the second direction PY.

Third Embodiment

FIG. 22 is a sectional view illustrating an example of a section of the display device according to a third embodiment of the present disclosure. The same components as those described in the embodiments described above are denoted by the same reference numerals, and the description thereof will not be repeated. FIG. 22 is a sectional view along XIX-XIX' of FIG. 12 in the same manner as the FIG. 19.

As illustrated in FIG. 22, in the third embodiment, a protective film 15 covering the pixel electrode PE is disposed above the slant surface of the third insulating layer 13 of the organic insulating material. The first orientation film AL1 is provided on the counter substrate side of the protective film 15.

The protective film 15 is formed of an inorganic insulating material having an insulating capability and a light transmitting capability, such as silicon nitride or silicon oxide. The protective film 15 is more difficult to be broken by the foreign material FM than the first orientation film AL1 is. Even if the first orientation film AL1 covering the pixel electrode PE is broken by the foreign matter FM, the occurrence of short circuit between the pixel electrode PE and the common electrode CE is reduced as long as the protective film 15 is not broken by the foreign matter FM. In the display device 1 of the third embodiment, the occurrence of short circuit between the pixel electrode PE and the common electrode CE is further reduced by the protective film 21 and the protective film 15 than in the display device 1 of the first embodiment.

The protective film 15 may be a light-blocking inorganic insulating film. The protective film 21 may be omitted when the protective film 15 is provided.

While the preferred embodiments have been described above, the present disclosure is not limited to such embodiments. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure.

For example, the present disclosure has been described on the assumption that the switching element Tr has a bottom-gate structure, but the switching element Tr is not limited to having a bottom-gate structure, and may have a top-gate structure as described above. If the switching element Tr has a top-gate structure, the structure can be described as follows with reference to the insulating film stacking structure of FIG. 15: the semiconductor layer SC is disposed between the first light-transmitting base member 19 and the first insulating layer; the gate electrode GE is disposed between the first insulating layer 11 and the second insulating layer 12; and the source electrode SE and the contact electrode DEA are formed between the second insulating layer 12 and the third insulating layer 13.

Moreover, a direct-current voltage may be supplied as the common potential. That is, the common potential may be constant. Alternatively, an alternating-current voltage may be supplied as the common potential. That is, the common potential may have two values of an upper limit value and a lower limit value. Whether the common potential is a direct-current potential or an alternating-current potential, the common potential is supplied to the holding capacitance electrode IC and the common electrode CE.

As for the third insulating layer 13 serving as a grid-shaped organic insulating film, the structure has been disclosed in which the third insulating layer 13 inside the grid-shaped region is totally removed to expose the second insulating layer 12 and the holding capacitance electrode IC in the lower layers. However, the present disclosure is not limited to this structure. For example, the structure may be such that a thin portion of the film thickness of the third insulating layer 13 is left remaining inside the grid-shaped region surrounded by the signal lines SL and the scan lines GL using a halftone exposure technique. With this structure, the film thickness of the third insulating layer 13 inside the grid-shaped region is made smaller than the film thickness of the grid-shaped region surrounded by the signal lines SL and the scan lines GL.

What is claimed is:

1. A display device comprising:
   an array substrate;
   a counter substrate; and
   a liquid crystal layer between the array substrate and the counter substrate,
   wherein the array substrate comprises, in a display region:
   a plurality of signal lines arranged at intervals in a first direction;
   a plurality of scan lines arranged at intervals in a second direction;
   a grid-shaped organic insulating layer that is provided along the scan lines and the signal lines in the array substrate and covers over the scan lines and the signal lines;
   a plurality of pixel electrodes each provided in a region surrounded by the scan lines and the signal lines; and
   a first orientation film that covers the pixel electrodes,
   wherein a portion of each of the pixel electrodes is provided above a slant surface of the organic insulating layer and overlaps the slant surface,
   wherein the counter substrate comprises:
   a common electrode located at a location that overlaps at least the pixel electrodes;
   an insulating protective film that covers the array substrate side of the common electrode that overlaps at least a portion of the organic insulating layer; and
   a second orientation film that covers the protective film and the common electrode, and
   wherein a region overlapping an opening surrounded by the scan lines and the signal lines has a non-overlapping region of the protective film where the common electrode and the second orientation film are directly stacked without interposing the protective film between the common electrode and the second orientation film.

2. The display device according to claim 1, wherein the protective film is provided above the slant surface of the organic insulating layer that covers over the scan lines and overlaps the slant surface.

3. The display device according to claim 1, wherein the protective film formed in a grid shape is provided above the slant surface of the organic insulating layer covering over the scan lines and the signal lines and overlaps the slant surface.

4. The display device according to claim 1,
   wherein a switching element is provided in the region surrounded by the scan lines and the signal lines,
   wherein at least the switching element is covered by the organic insulating layer, and
   wherein the protective film having a larger area than that of the switching element is provided above the organic insulating layer and overlaps the organic insulating layer.

5. The display device according to claim 1, wherein the protective film is formed of an inorganic insulating material.

6. The display device according to claim 5, wherein a thickness of the protective film is from 50 nm to 400 nm.

7. The display device according to claim 1, wherein the portion of the pixel electrode provided above the slant surface of the organic insulating layer and overlapping the slant surface is covered with a second protective film.

8. The display device according to claim 1,
   wherein the liquid crystal layer comprises polymer-dispersed liquid crystals, and
   wherein a background of the counter substrate is visible from the array substrate, and a background of the array substrate is visible from the counter substrate.

\* \* \* \* \*